US012635358B2

(12) United States Patent
Cha et al.

(10) Patent No.: US 12,635,358 B2
(45) Date of Patent: May 19, 2026

(54) ELECTROLUMINESCENT DISPLAY DEVICE

(71) Applicant: LG Display Co., Ltd., Seoul (KR)

(72) Inventors: Eonho Cha, Incheon (KR);
GyuHyeong Han, Seoul (KR);
Yoonseok Lee, Paju-si (KR); **Hyemin
Hwang**, Yeongcheon-si (KR);
Jonghoon Yeo, Goyang-si (KR)

(73) Assignee: LG DISPLAY CO., LTD., Seoul (KR)

( * ) Notice: Subject to any disclaimer, the term of this
patent is extended or adjusted under 35
U.S.C. 154(b) by 601 days.

(21) Appl. No.: 17/956,458

(22) Filed: Sep. 29, 2022

(65) Prior Publication Data

US 2023/0189578 A1 Jun. 15, 2023

(30) Foreign Application Priority Data

Dec. 15, 2021 (KR) ........................ 10-2021-0179575

(51) Int. Cl.
H10K 59/124 (2023.01)
H10K 59/80 (2023.01)
(52) U.S. Cl.
CPC ......... H10K 59/124 (2023.02); H10K 59/873
(2023.02); H10K 59/874 (2023.02)
(58) Field of Classification Search
CPC .. H10K 59/124; H10K 50/844; H10K 50/846;
H10K 59/874; H10K 59/873; H10K
59/1213; H10K 50/841; H10K 59/122;
H10K 59/131; H10D 86/451; H10D
86/60; H10D 86/40
See application file for complete search history.

(56) References Cited

U.S. PATENT DOCUMENTS

| | | | | |
|---|---|---|---|---|
| 2005/0110020 A1* | 5/2005 | Hayashi | ................. | H10D 86/00 |
| | | | | 257/E27.111 |
| 2015/0076476 A1* | 3/2015 | Odaka | ................. | H10K 59/124 |
| | | | | 438/33 |
| 2015/0282259 A1* | 10/2015 | Yamada | ................. | H10K 59/12 |
| | | | | 445/24 |

(Continued)

FOREIGN PATENT DOCUMENTS

| | | |
|---|---|---|
| CN | 111384104 A | 7/2020 |
| CN | 112447930 A | 3/2021 |

(Continued)

*Primary Examiner* — Chad M Dicke
*Assistant Examiner* — Gary Abel
(74) *Attorney, Agent, or Firm* — Birch, Stewart, Kolasch
& Birch, LLP

(57) ABSTRACT

An electroluminescent display device can include a substrate
including an active area and a non-active area having a gate
in panel (GIP) area, a thin film transistor disposed on the
substrate, a GIP circuit unit disposed on the substrate in the
GIP area, a sacrificial layer disposed on the GIP circuit unit,
a planarization layer disposed over the thin film transistor
and the sacrificial layer, an anode disposed on the planar-
ization layer, a bank disposed on the planarization layer and
exposing a portion of the anode, a light emitting unit and a
cathode disposed on the anode and the bank, a trench pattern
disposed on the sacrificial layer, and a buffer layer disposed
on the cathode and an inner surface of the trench pattern. As
a result, reliability of the display panel can be improved by
preventing diffusion of residual foreign materials and mois-
ture permeation.

20 Claims, 19 Drawing Sheets

(56)        References Cited

U.S. PATENT DOCUMENTS

| | | | |
|---|---|---|---|
| 2017/0352706 A1* | 12/2017 | Choi | H10K 71/621 |
| 2019/0206956 A1* | 7/2019 | Kim | H10K 59/88 |
| 2019/0245015 A1* | 8/2019 | Lee | H10K 59/8722 |
| 2020/0168685 A1* | 5/2020 | Bang | G06F 3/0412 |
| 2020/0212140 A1 | 7/2020 | Huh | |
| 2021/0066418 A1* | 3/2021 | Seo | H10K 59/88 |
| 2021/0091320 A1* | 3/2021 | Choi | H10K 59/131 |
| 2023/0189578 A1 | 6/2023 | Cha et al. | |
| 2024/0215333 A1* | 6/2024 | Wang | H10K 59/124 |

FOREIGN PATENT DOCUMENTS

| | | |
|---|---|---|
| KR | 10-2016-0081311 A | 7/2016 |
| KR | 10-2019-0081953 A | 7/2019 |
| KR | 10-2020-0062445 A | 6/2020 |
| KR | 10-2021-0028789 A | 3/2021 |
| KR | 10-2021-0035959 A | 4/2021 |
| KR | 10-2022-0061416 A | 5/2022 |
| KR | 10-2023-0090639 A | 6/2023 |

* cited by examiner

ELECTROLUMINESCENT DISPLAY DEVICE

CROSS-REFERENCE TO RELATED APPLICATIONS

This application claims the benefit of and priority to Korean Patent Application No. 10-2021-0179575 filed on Dec. 15, 2021, in the Republic of Korea, the entire contents of which are hereby expressly incorporated by reference into the present application.

BACKGROUND

Technical Field

The present disclosure relates to an electroluminescent display device, and more particularly, to an electroluminescent display device having a narrow bezel.

Discussion of the Related Art

Recently, as our society advances toward an information-oriented society, the field of display devices for visually expressing an electrical information signal has rapidly advanced. Various display devices having excellent performance in terms of thinness, lightness, and low power consumption, are being developed correspondingly.

Representative display devices include a liquid crystal display device (LCD), an electro-wetting display device (EWD), an organic light emitting display device (OLED), and the like.

Among these display devices, an electroluminescent display device including an organic light emitting display device is a self-emission display device, and can be manufactured to be light and thin since it does not require a separate light source, unlike a liquid crystal display device having a separate light source.

In addition, the electroluminescent display device has advantages in terms of power consumption due to a low voltage driving, and is excellent in terms of a color implementation, a response speed, a viewing angle, and a contrast ratio (CR). Therefore, electroluminescent display devices are expected to be utilized in various fields.

The electroluminescent display device is constructed by disposing a light emitting layer using an organic material between two electrodes that are referred to as an anode and a cathode. Then, when holes from the anode are injected into the light emitting layer and electrons from the cathode are injected into the light emitting layer, the injected electrons and holes recombine with each other to form excitons in the light emitting layer and emit light.

SUMMARY OF THE DISCLOSURE

An aspect of the present disclosure is to provide an electroluminescent display device allowing for a reduction in a bezel width while having improved reliability.

Objects of the present disclosure are not limited to the above-mentioned objects, and other objects, which are not mentioned above, can be clearly understood by those skilled in the art from the following descriptions.

An electroluminescent display device according to an exemplary embodiment of the present disclosure can include a substrate including an active area and a non-active area having a gate in panel (GIP) area, a thin film transistor disposed on the substrate, a GIP circuit unit disposed on the substrate in the GIP area, a sacrificial layer disposed on the GIP circuit unit, a planarization layer disposed over the thin film transistor and the sacrificial layer, an anode disposed on the planarization layer, a bank disposed on the planarization layer and exposing a portion of the anode, a light emitting unit and a cathode disposed on the bank and the anode which is exposed, a trench pattern disposed on the sacrificial layer and from which the cathode, the light emitting unit, the bank, and the planarization layer are removed, and a buffer layer made of silicon nitride and disposed on the cathode and an inner surface of the trench pattern.

Other detailed matters of the exemplary embodiments are included in the detailed description and the drawings.

According to the present disclosure, vertical partition walls and a trench pattern can be formed in an outside of a display panel to thereby prevent diffusion of residual foreign materials and moisture permeation, so that reliability of the display panel can be improved.

In addition, according to the present disclosure, reliability of the display panel can be improved by forming a buffer layer formed of silicon nitride on an inner surface of a trench pattern.

In addition, according to the present disclosure, a sacrificial layer can be formed under a trench pattern to absorb laser energy generated during laser ablation, thereby preventing damage to a gate in panel (GIP) circuit therebelow. Accordingly, a laser patterning area can be minimized, so that a bezel width can be reduced.

Further, according to the present disclosure, a hydrogen blocking layer can be formed on an inner surface of a trench pattern to thereby block an inflow of hydrogen generated when a passivation layer is formed, so that reliability of a display panel can be improved.

The effects according to the present disclosure are not limited to the contents exemplified above, and more various effects are included in the present specification.

BRIEF DESCRIPTION OF THE DRAWINGS

The present disclosure will become more fully understood from the detailed description given hereinbelow and the accompanying drawings which are given by way of illustration only, and thus are not limitative of the present disclosure.

DETAILED DESCRIPTION OF THE EMBODIMENTS

Figure 1:
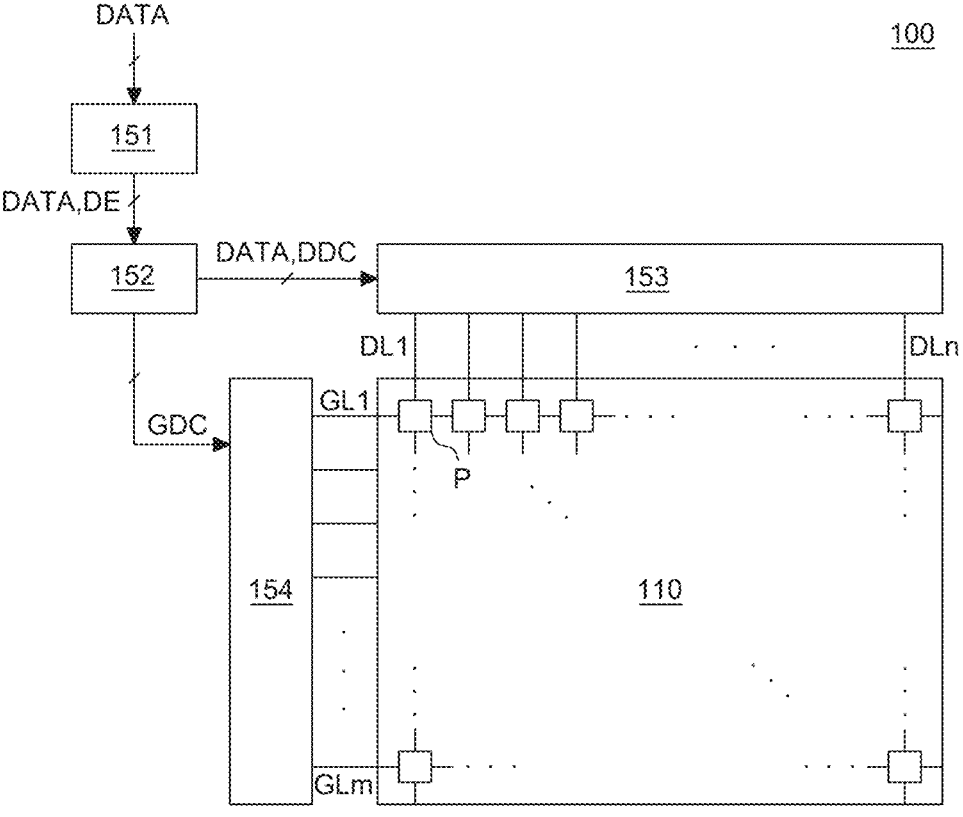
FIG. 1 is a block diagram of an electroluminescent display device according to a first embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "consist of" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "over', "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms. These terms are merely used for distinguishing one component from the other components. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, various exemplary embodiments of the present disclosure will be described in detail with reference to the accompanying drawings. All the components of each display device according to all embodiments of the present disclosure are operatively coupled and configured.

FIG. 1 is a block diagram of an electroluminescent display device according to a first exemplary embodiment of the present disclosure.

Referring to FIG. 1, an electroluminescent display device 100 according to the first exemplary embodiment of the present disclosure can include an image processor 151, a timing controller 152, a data driver 153, a gate driver 154, and a display panel 110.

The image processor 151 can output a data signal DATA, a data enable signal DE and the like through a data signal DATA supplied from the outside.

The image processor 151 can output one or more of a vertical synchronization signal, a horizontal synchronization signal, and a clock signal in addition to the data enable signal DE.

The timing controller 152 receives the data signal DATA together with the data enable signal DE or driving signals including the vertical synchronization signal, the horizontal synchronization signal, and the clock signal from the image processor 151. The timing controller 152 can output a gate timing control signal GDC for controlling an operation timing of the gate driver 154 and a data timing control signal DDC for controlling an operation timing of the data driver 153 based on the driving signals.

In this case, the data driver 153 can sample and latch the data signal DATA supplied from the timing controller 152 in response to the data timing control signal DDC supplied from the timing controller 152, and convert the data signal DATA into a gamma reference voltage to thereby output it. The data driver 153 can output the data signal DATA through data lines DL1 to DLn.

In addition, the gate driver 154 can output a gate signal while shifting a level of the gate voltage in response to the gate timing control signal GDC supplied from the timing controller 152. The gate driver 154 can output the gate signal through gate lines GL1 to GLm.

The display panel 110 can display an image while sub-pixels P emit light in response to the data signal DATA and the gate signal supplied from the data driver 153 and the gate driver 154. A detailed structure of the sub-pixel P will be described in detail in FIG. 2 to FIG. 4.

Figure 2:
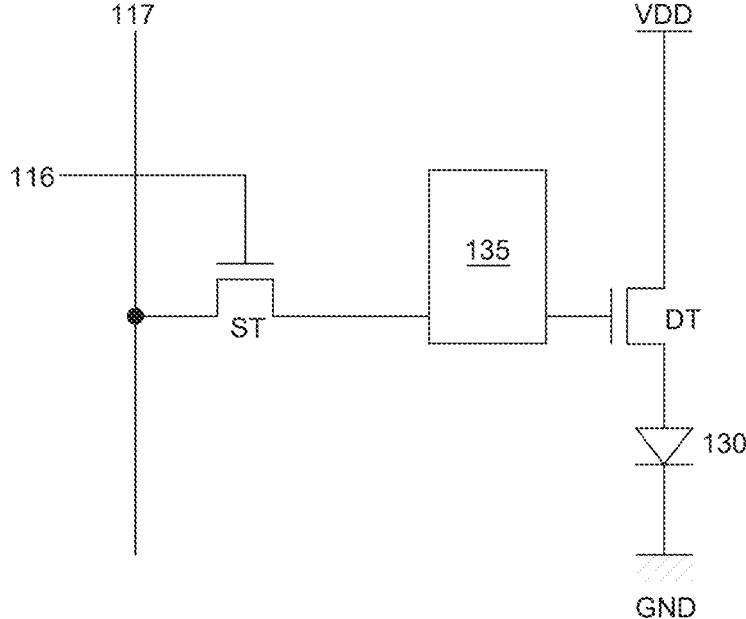
FIG. 2 is a circuit diagram of a sub-pixel of the electroluminescent display device according to the first embodiment of the present disclosure.

FIG. 2 is a circuit diagram of a sub-pixel of the electroluminescent display device according to the first exemplary embodiment of the present disclosure.

Referring to FIG. 2, the sub-pixel of the electroluminescent display device according to the first exemplary embodiment of the present disclosure can include a switching transistor ST, a driving transistor DT, a compensation circuit 135, and a light emitting element 130.

The light emitting element 130 can operate to emit light according to a driving current that is formed by the driving transistor DT.

The switching transistor ST can perform a switching operation so that a data signal supplied through a data line 117 in response to a gate signal supplied through a gate line 116 is stored as a data voltage in a capacitor.

The driving transistor DT can operate so that a constant driving current flows between a high potential power line VDD and a low potential power line GND in response to the data voltage stored in the capacitor.

The compensation circuit 135 is a circuit for compensating for a threshold voltage or the like of the driving transistor DT, and the compensation circuit 135 can include one or more thin film transistors and capacitors. A configuration of the compensation circuit 135 can vary according to a compensation method.

It is illustrated that the sub-pixel shown in FIG. 2 is configured to have a 2T (Transistor) 1C (Capacitor) structure including the switching transistor ST, the driving transistor DT, the capacitor, and the light emitting element 130. However, the sub-pixel can have various structures, such as 3T1C, 4T2C, 5T2C, 6T1C, 6T2C, 7T1C and 7T2C structures when the compensation circuit 135 is added thereto.

Figure 3:
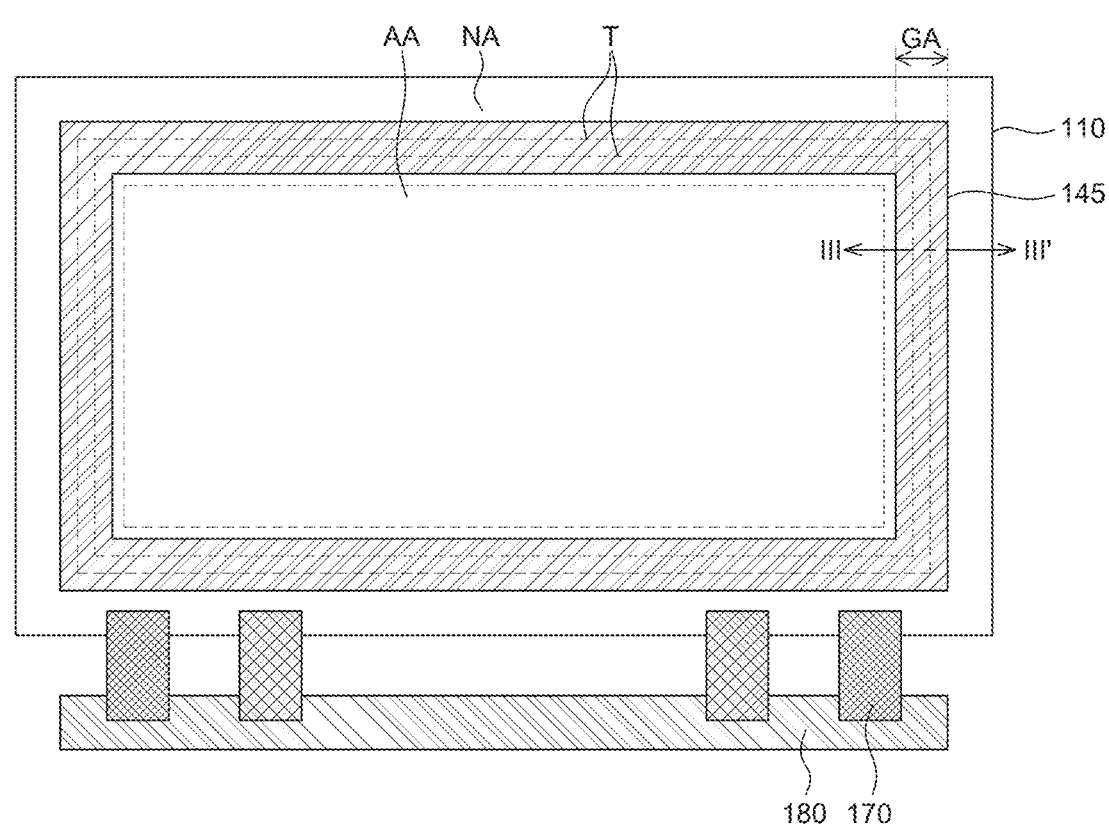
FIG. 3 is a plan view of the electroluminescent display device according to the first embodiment of the present disclosure.

FIG. 3 is a plan view of the electroluminescent display device according to the first exemplary embodiment of the present disclosure.

Figure 4:
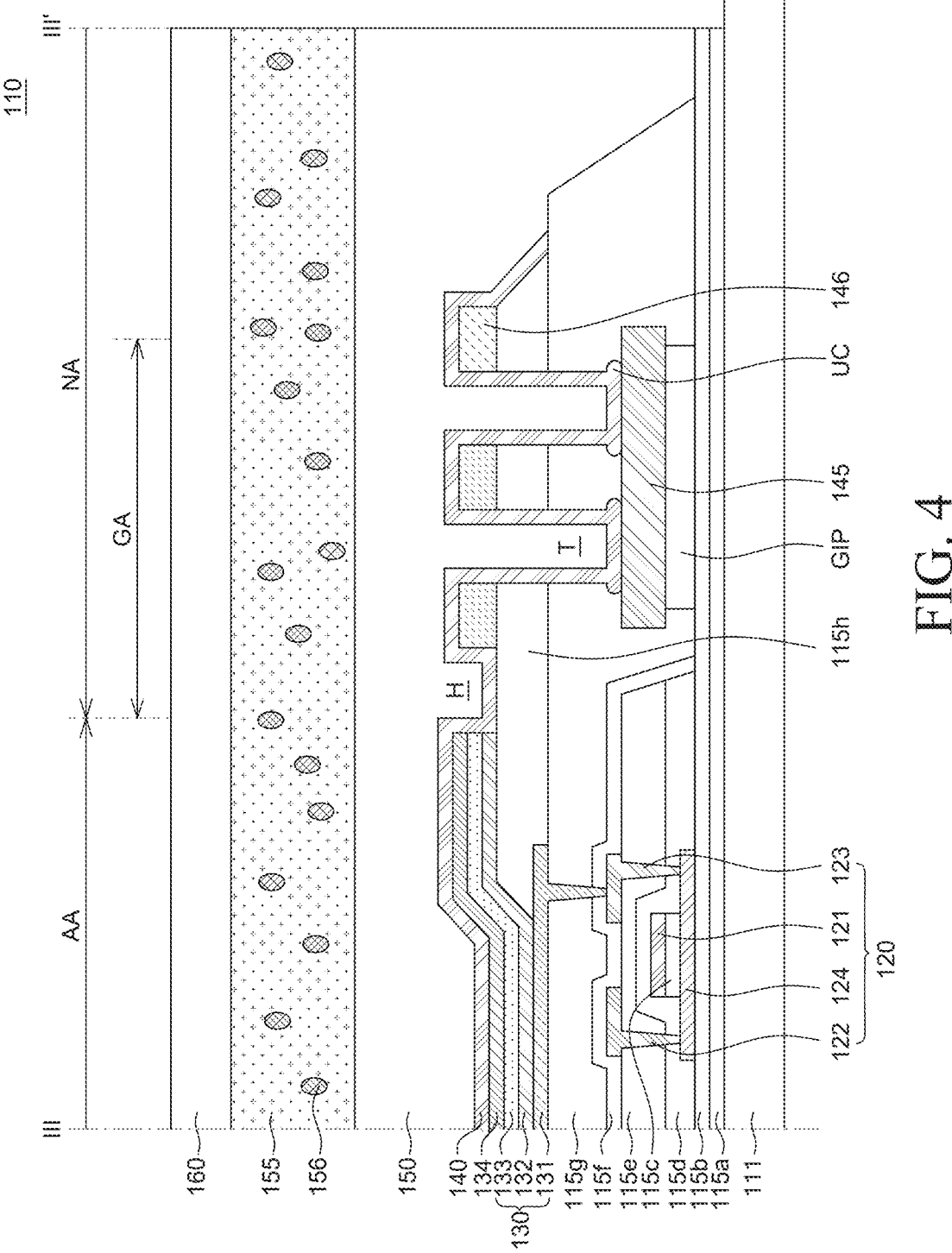
FIG. 4 is a cross-sectional view taken along III-III' of FIG. 3.

FIG. 4 is a cross-sectional view taken along III-III' of FIG. 3.

More specifically, FIG. 4 illustrates a cross-section of the display panel 110 according to the first exemplary embodiment of the present disclosure including a part of a gate in panel (GIP). FIG. 4 schematically illustrates a GIP circuit unit GIP in the non-active area NA for convenience of explanation. The GIP circuit unit GIP can include various components.

Referring to FIG. 3, the electroluminescent display device 100 according to the first exemplary embodiment of the present disclosure can include the display panel 110, flexible films 170, and a printed circuit board 180.

The display panel 110 is a panel for displaying an image to a user.

In the display panel 110, display elements for displaying an image, a driving element for driving the display elements, and lines for transmitting various signals to the display elements and the driving element can be disposed. The display element can be defined differently according to a type of the display panel 110. For example, when the display panel 110 is an organic light emitting display panel, the display element can be an organic light emitting element including an anode, an organic light emitting layer, and a cathode.

Hereinafter, it is described assuming that the display panel 110 is an organic light emitting display panel, but the display panel 110 is not limited to the organic light emitting display panel.

The display panel 110 can include an active area AA and a non-active area NA. The active area AA is an area in which an image is displayed on the display panel 110.

A plurality of sub-pixels constituting a plurality of pixels and circuits for driving the plurality of sub-pixels can be disposed in the active area AA. The plurality of sub-pixels are minimum units constituting the active area AA, and the display element can be disposed in each of the plurality of sub-pixels, and the plurality of sub-pixels can constitute the pixel. For example, an organic light emitting element including an anode, an organic light emitting layer, and a cathode can be disposed in each of the plurality of sub-pixels, but is not limited thereto. In addition, the circuit for driving the plurality of sub-pixels can include a driving element, lines and the like. For example, the circuit can be formed of a thin film transistor, a storage capacitor, a gate line, a data line, and the like, but is not limited thereto.

The non-active area NA is an area in which an image is not displayed.

FIG. 3 illustrates that the non-active area NA surrounds the active area AA having a quadrangular shape, but shapes and arrangements of the active area AA and the non-active area NA are limited to the example illustrated in FIG. 3.

The active area AA and the non-active area NA can have a shape suitable for designing an electronic apparatus on which the electroluminescent display device 100 is mounted. For example, other example shape of the active area AA can include a pentagonal shape, a hexagonal shape, a circular shape, an oval shape and the like.

Various lines and circuits for driving the organic light emitting element of the active area AA can be disposed in the non-active area NA. For example, in the non-active area NA, driver ICs such as a gate driver IC and a data driver IC or link lines for transmitting signals to the plurality of sub-pixels and circuits of the active area AA can be disposed, but are not limited thereto.

Meanwhile, left and right sides of FIG. 3 can be defined as a gate pad portion on which the gate driver IC is disposed, and a lower side of FIG. 3 can be defined as a data pad portion to which the flexible films are connected, but the present disclosure is not limited thereto.

The gate driver IC can be formed independently of the display panel 110 and can be configured in a form capable of being electrically connected to the display panel 110 in various manners, but can be configured in a gate in panel (GIP) manner in which it is mounted in the display panel 110.

The electroluminescent display device 100 can include various additional elements for generating various signals or driving the pixels in the active area AA. The additional elements for driving the pixels can include an inverter circuit, a multiplexer, an electro-static discharge (ESD) circuit, and the like. The electroluminescent display device 100 can include additional elements associated with functions other than driving the pixels. For example, the electroluminescent display device 100 can include additional elements that provide a touch sensing function, a user authentication function (e.g., fingerprint recognition), a multi-level pressure sensing function, a tactile feedback function, and the like. Such additional elements can be positioned in the non-active area NA and/or in an external circuit connected to a connection interface.

In addition, the flexible films 170 are films for supplying signals to the plurality of sub-pixels and circuits of the active area AA, and can be electrically connected to the display panel 110. The flexible films 170 can be disposed at one end of the non-active area NA of the display panel 110 and supply a power voltage, a data voltage and the like to the plurality of sub-pixels and circuits of the active area AA. For example, a driver IC such as a data driver IC can be disposed on the flexible film 170.

The printed circuit board 180 can be disposed at one ends of the flexible films 170 and connected to the flexible films 170. The printed circuit board 180 is a component that supplies signals to the driver IC. The printed circuit board 180 can supply various signals such as a driving signal and a data signal to the driver IC.

Meanwhile, in the electroluminescent display device, a minimum bezel distance is required to secure reliability such as moisture penetration prevention, and demand for slimming of the non-active area except for the active area where an image is displayed, is also increasing in accordance with demand for slimming of display devices. In this case, when a cathode and a light emitting unit are deposited, a shadow area is generated due to a gap between a mask and a substrate and accordingly, there is a limit in reducing a bezel width. In addition, moisture can be diffused through the shadow area, causing defects in reliability.

Accordingly, the first exemplary embodiment of the present disclosure is characterized in that, vertical partition walls and a trench pattern T are formed in an outside of the display panel 110, for example, in the shadow area, to thereby prevent diffusion of residual foreign materials and moisture permeation, whereby reliability of the display panel 110 is improved. In addition, an existing shadow area is converted into a reliable bezel area, so that a bezel width can be reduced.

The partition walls and the trench pattern T according to the first exemplary embodiment of the present disclosure can be formed in a quadrangular frame shape over four sides of the non-active area NA surrounding the active area AA, but is not limited thereto, and can be formed over three sides of the non-active area NA except for a lower portion of the display panel 110 to which the flexible films 170 are connected.

The trench pattern T can be formed by, for example, removing a capping layer, a cathode, a light emitting unit, and a planarization layer between the partition walls in the shadow area through laser ablation. Accordingly, a reliable bezel area can be expanded, and a bezel width can be reduced by an amount equal to a length of the reliable bezel area that is added.

In addition, the first exemplary embodiment of the present disclosure is characterized in that a sacrificial layer 145 is formed under the partition walls and trench pattern T along the partition walls and trench pattern T to absorb laser energy generated during laser ablation, thereby preventing damage to a GIP circuit. Various components constituting the electroluminescent display device 100 of the present disclosure including the partition walls, the trench pattern T, and the sacrificial layer 145 will be described in detail with reference to FIG. 4.

Specifically, referring to FIG. 4, a substrate 111 can be divided into an active area AA and a non-active area NA outside the active area AA.

A thin film transistor 120 and the light emitting element 130 can be disposed in the active area AA of the substrate 111.

The non-active area NA of the substrate 111 can include the GIP area GA. The GIP circuit unit GIP can be disposed in the GIP area GA of the substrate 111.

The substrate 111 serves to support and protect components of the electroluminescent display device disposed thereon.

Recently, the flexible substrate 111 can be used with a flexible material having flexible characteristics such as plastic.

The flexible substrate 111 can be in a form of a film including one of the group consisting of a polyester-based polymer, a silicone-based polymer, an acrylic polymer, a polyolefin-based polymer, and a copolymer thereof.

A light blocking layer can be disposed on the substrate 111. The light blocking layer can be formed of a metallic material having a light blocking function in order to block external light from being introduced into a semiconductor layer 124.

The light blocking layer can be formed in a single layer or multilayer structure formed of any one of opaque metals such as aluminum (Al), chromium (Cr), tungsten (W), titanium (Ti), neodymium (Nd), nickel (Ni), molybdenum (Mo) and copper (Cu), or alloys thereof.

Buffer layers 115a and 115b can be disposed over the substrate 111 on which the light blocking layer is disposed.

The buffer layers 115a and 115b are functional layers for protecting various electrodes and lines from impurities such as moisture, oxygen, alkali ions and the like that are introduced from the substrate 111 or a lower portion thereof, and can have a multilayer structure formed of a first buffer layer 115a and a second buffer layer 115b, but the present disclosure is not limited thereto. The buffer layers 115a and 115b can be formed of silicon oxide (SiOx), silicon nitride (SiNx), or a multilayer structure thereof. The buffer layers 115a and 115b can be deleted depending on a type of the thin film transistor 120.

The buffer layers 115a and 115b can include a contact hole exposing a portion of the light blocking layer.

The thin film transistor 120 can be disposed on the buffer layers 115a and 115b.

The thin film transistor 120 in the active area AA can be a driving transistor, and for convenience, only the driving transistor 120 is illustrated in FIG. 4. Other switching transistors, sensing transistors, compensation circuits and the like can be included in the electroluminescent display device 100.

In this case, the driving transistor 120 can transmit a current that is transmitted through a power line to an anode 131 according to a signal received from a switching transistor, and can control light emission by the current transmitted to the anode 131.

To this end, the driving transistor 120 can include a gate electrode 121, the semiconductor layer 124, a source electrode 122, and a drain electrode 123.

The switching transistor is turned on by a gate pulse supplied to a gate line and transmits a data voltage that is supplied to a data line to the gate electrode 121 of the driving transistor 120.

The semiconductor layer 124 can be disposed on the second buffer layer 115b.

The semiconductor layer 124 can be formed of polysilicon (p-Si), and in this case, a predetermined region thereof can be doped with an impurity. In addition, the semiconductor layer 124 can be formed of amorphous silicon (a-Si) or can be formed of various organic semiconductor materials such as pentacene and the like. Furthermore, the semiconductor layer 124 can be formed of an oxide semiconductor.

The oxide semiconductor has excellent mobility and uniformity properties. The oxide semiconductor can be formed of a quaternary metal oxide such as an indium tin gallium zinc oxide (InSnGaZnO)-based material, a ternary metal oxide such as an indium gallium zinc oxide (InGaZnO)-based material, an indium tin zinc oxide (InSnZnO)-based material, an indium aluminum zinc oxide (InAlZnO)-based material, a tin gallium zinc oxide (SnGaZnO)-based material, an aluminum gallium zinc oxide (AlGaZnO)-based material, and a tin aluminum zinc oxide (SnAlZnO)-based material, a binary metal oxide such as an indium zinc oxide (InZnO)-based material, a tin zinc oxide (SnZnO)-based material, an aluminum zinc oxide (AlZnO)-based material, a zinc magnesium oxide (ZnMgO)-based material, a tin magnesium oxide (SnMgO)-based material, an indium oxide (InO)-based material, a tin oxide (SnO)-based material, an indium gallium oxide (InGaO)-based material, a zinc oxide (ZnO)-based material and an indium magnesium oxide (InMgO)-based material, or the like. Composition ratios of the respective elements are not limited.

The semiconductor layer 124 can include a source region and a drain region including p-type or n-type impurities, and can further include a low concentration-doped region between the source region and the drain region adjacent to the channel region, but the present disclosure is not limited thereto.

The source region and the drain region are regions doped with a high concentration of impurities, and can be connected to the source electrode 122 and the drain electrode 123 of the thin film transistor 120, respectively.

As an impurity ion, the p-type impurity or n-type impurity can be used. The p-type impurity can be one of boron (B), aluminum (Al), gallium (Ga), and indium (In), and the n-type impurity can be one of phosphorus (P), arsenic (As), and antimony (Sb).

The channel region can be doped with the n-type impurity or p-type impurity according to a thin film transistor structure of the NMOS or PMOS.

A gate insulating layer 115c can be disposed on the semiconductor layer 124. For example, the gate insulating layer 115c can be formed of an insulating inorganic material such as silicon oxide (SiOx) or silicon nitride (SiNx), and can be formed of an insulating organic material.

The gate electrode 121 can be disposed on the gate insulating layer 115c. The gate electrode 121 can be formed of various conductive materials, for example, magnesium (Mg), aluminum (Al), nickel (Ni), chromium (Cr), molybdenum (Mo), tungsten (W), gold (Au), or alloys of them.

A first interlayer insulating layer 115d can be disposed on the gate electrode 121, and a second interlayer insulating layer 115e can be disposed thereon. However, the present disclosure is not limited thereto, and only the first interlayer insulating layer 115d can be disposed.

The first interlayer insulating layer 115d and the second interlayer insulating layer 115e can be formed of silicon oxide (SiOx), silicon nitride (SiNx), or a multilayer structure thereof.

The source electrode 122 and the drain electrode 123 can be disposed on the second interlayer insulating layer 115e.

The source electrode 122 and the drain electrode 123 can be composed of a single layer or multiple layers of a metallic material such as aluminum (Al), molybdenum (Mo), chromium (Cr), gold (Au), titanium (Ti), nickel (Ni), neodymium (Nd) or copper (Cu) which is a conductive metal, or an alloy thereof, but the present disclosure is not limited thereto.

A passivation layer 115f can be disposed on the thin film transistor 120 configured as described above.

For example, the passivation layer 115f can be formed of an inorganic insulating layer such as silicon oxide (SiOx) or silicon nitride (SiNx).

The passivation layer 115f can serve to prevent unnecessary electrical connection between components disposed thereon and therebelow and to prevent contamination or damage from the outside, and may be omitted depending on configurations and characteristics of the thin film transistor 120 and the light emitting element 130.

The thin film transistors 120 can be classified into a coplanar structure and an inverted staggered structure according to positions of components constituting the thin film transistor 120. For example, in the thin film transistor having the inverted staggered structure, the gate electrode can be positioned on an opposite side of the source electrode and the drain electrode with respect to the semiconductor layer. As illustrated in FIG. 4, in the thin film transistor 120 having a coplanar structure, the gate electrode 121 can be positioned on the same side as the source electrode 122 and the drain electrode 123 with respect to the semiconductor layer 124.

Although the thin film transistor 120 having the coplanar structure is illustrated in FIG. 4, the present disclosure is not limited thereto, and the electroluminescent display device 100 according to the first exemplary embodiment of the present disclosure can include a thin film transistor having the inverted staggered structure. In addition, some of the thin film transistors 120 can have the coplanar structure, and some of the thin film transistors 120 can have the inverted staggered structure.

Meanwhile, the sacrificial layer 145 can be disposed on the GIP circuit unit GIP in the non-active area NA.

The sacrificial layer 145 is characterized by preventing damage to the GIP circuit by absorbing laser energy that is generated during laser ablation for forming the trench pattern T. Accordingly, a laser patterning area can be minimized, so that a bezel width can be reduced.

The sacrificial layer 145 can be formed of a black resin, but is not limited thereto.

The sacrificial layer 145 can have a thickness of about 2 µm, but is not limited thereto.

A planarization layer 115g can be disposed over the thin film transistor 120 and the GIP circuit unit GIP to protect the thin film transistor 120 and the GIP circuit unit GIP and alleviate a step that is caused by them, and to reduce parasitic capacitance generated between the thin film transistor 120, the light emitting element 130, the GIP circuit unit GIP and various lines.

The planarization layer 115g can be formed of one or more materials among acrylic resin, epoxy resin, phenolic resin, polyamides resin, polyimides resin, unsaturated polyesters resin, polyphenylene resin, benzocyclobutene resin and polyphenylene sulfides resins, but the present disclosure is not limited thereto.

The planarization layer 115g can extend to a portion of the non-active area NA including the GIP area GA, but is not limited thereto. The planarization layer 115g can be disposed to have an inclined side surface, but is not limited thereto.

The light emitting element 130 including the anode 131, a light emitting unit 132, and a cathode 133 can be disposed on the planarization layer 115g.

The anode 131 can be disposed on the planarization layer 115g. The anode 131 is an electrode serving to supply holes to the light emitting unit 132, and can be connected to the thin film transistor 120 through a contact hole in the planarization layer 115g.

In the case of a bottom emission type, the anode 131 can be formed of indium tin oxide (ITO), indium zinc oxide (IZO) or the like, which is a transparent conductive material, but the present disclosure is limited thereto.

On the other hand, when the display panel 110 is a top emission type in which light is emitted to an upper portion on which the cathode 133 is disposed, it can further include a reflective layer so that emitted light is reflected from the anode 131 and is more smoothly emitted in a direction toward the upper portion where the cathode 133 is disposed.

For example, the anode 131 can be a two-layer structure in which a transparent conductive layer formed of a transparent conductive material and a reflective layer are sequentially stacked, or a three-layer structure in which a transparent conductive layer, a reflective layer and a transparent conductive layer are sequentially stacked. The reflective layer can be formed of silver (Ag) or an alloy including silver.

A bank 115h can be disposed on the anode 131 and the planarization layer 115g.

The bank 115h disposed on the anode 131 and the planarization layer 115g can define the sub-pixels by partitioning an area that actually emits light, for example, an emission area.

After a photoresist is formed on the anode 131, the bank 115h can be formed through a photolithography process. The photoresist refers to a photosensitive resin of which solubility in a developer is changed by an action of light, and a specific pattern can be obtained by exposing and developing the photoresist. The photoresist can be classified into a positive type photoresist and a negative type photoresist. In this case, the positive photoresist refers to a photoresist of which solubility in a developer for an exposed portion is increased by exposure, and when the positive photoresist is developed, a pattern in which the exposed portion is removed is obtained. The negative photoresist refers to a photoresist of which solubility in a developer for an exposed portion is lowered by exposure, and when the negative photoresist is developed, a pattern in which an unexposed portion is removed is obtained.

A fine metal mask (FMM), which is a deposition mask, can be used to form the light emitting unit 132 of the light emitting element 130.

In addition, in order to prevent damage that can be caused by contact with the deposition mask disposed on the bank 115h and to maintain a constant distance between the bank 115h and the deposition mask, a spacer formed of one of benzocyclobutene, photoacrylic, and polyimide, which is a transparent organic material, can be disposed on the bank 115h.

In this case, the bank 115h in the emission area can be removed to thereby expose a portion of the anode 131.

The bank 115h can be disposed to extend to a portion of the non-active area NA, but is not limited thereto. The bank 115h can extend to a front of an inclined side surface of the planarization layer 115g in the non-active area NA.

The light emitting unit 132 can be disposed between the anode 131 and the cathode 133.

The light emitting unit 132 which serves to emit light, can include at least one layer of a hole injection layer (HIL), a hole transport layer (HTL), a light emitting layer, an electron transport layer (ETL), and an electron injection layer (EIL), and some of the components may be omitted according to a structure or characteristics of the electroluminescent display device. Here, as the light emitting layer, an electroluminescent layer and an inorganic light emitting layer can also be applied.

The hole injection layer is disposed on the anode 131 and serves to facilitate hole injection.

The hole transport layer is disposed on the hole injection layer and serves to facilitate hole transfer to the light emitting layer.

The light emitting layer is disposed on the hole transport layer, and can include a material capable of emitting light of a specific color to thereby emit light of a specific color. In addition, a light emitting material can be formed using a phosphorescent material or a fluorescent material.

The electron injection layer can be further disposed on the electron transport layer. The electron injection layer is an organic layer that facilitates injection of electrons from the cathode 133, and may be omitted according to the structure and characteristics of the electroluminescent display device.

Meanwhile, in the case of further disposing an electron blocking layer and/or a hole blocking layer for blocking a flow of holes or electrons at a position adjacent to the light emitting layer, it is possible to prevent a phenomenon in which the electrons move from the light emitting layer when injected into the light emitting layer and pass through the hole transport layer adjacent thereto or a phenomenon in which the holes move from the light emitting layer when injected into the light emitting layer and pass through the electron transport layer adjacent thereto, so that luminous efficiency can be improved.

The light emitting unit 132 can be disposed to extend to a boundary between the active area AA and the non-active area NA, but is not limited thereto.

The cathode 133 can be disposed on the light emitting unit 132.

The cathode 133 serves to supply electrons to the light emitting unit 132. Since the cathode 133 needs to supply electrons, it can be formed of a metallic material such as magnesium, silver-magnesium or the like, which is a conductive material having a low work function, but is not limited thereto.

On the other hand, when the display panel 110 is a top emission type, the cathode 133 can be formed of a transparent conductive oxide, such as indium tin oxide (ITO), indium zinc oxide (IZO), indium tin zinc oxide (ITZO), zinc oxide (ZnO), and tin oxide (TO).

The cathode 133 can be disposed to extend to a portion of the non-active area NA. For example, the cathode 133 can be disposed to extend to the boundary between the active area AA and the non-active area NA so as to coincide with an end of the light emitting unit 132, but is not limited thereto.

A capping layer 134 can be disposed on the cathode 133.

The capping layer 134 can serve to help light emitted from the light emitting unit 132 to be efficiently emitted to the outside while protecting the light emitting element 130.

For example, the capping layer 134 can be formed of various organic compounds having a refractive index of 1.7 or higher in order to prevent light that is emitted to the outside from being lost due to total reflection.

The capping layer 134 can be disposed to extend to a portion of the non-active area NA. For example, the capping layer 134 can be disposed to extend to the boundary between the active area AA and the non-active area NA so as to coincide with the end of the light emitting unit 132, but is not limited thereto.

Meanwhile, the first exemplary embodiment of the present disclosure is characterized in that the partition walls 146 having a height of about 2 μm are formed on the bank 115h in the non-active area NA.

The partition walls 146 can be formed of flexible plastic such as polyethylene naphthalate (PEN), but are not limited thereto.

The partition walls 146 can have a taper angle of about 90 degrees to prevent diffusion of residual foreign materials, but are not limited thereto.

The partition walls 146 can have a quadrangular frame shape over four sides of the non-active area NA surrounding the active area AA, but are not limited thereto, and can be formed over three sides of the non-active area NA except for the lower portion of the display panel 110 to which the flexible films are connected.

As the partition wall 146 is additionally disposed on the bank 115h in the non-active area NA, a cell gap which is a distance from an encapsulation substrate 160, can be reduced by a height of the partition wall 146 to thereby delay moisture penetration. For example, when the partition wall 146 having a height of about 2 μm is applied, it can be seen that a distance between the substrate 111 and a second adhesive layer 155 is about 10 μm, whereas a distance between the partition wall 146 and the second adhesive layer 155 is about 5 μm, which is lowered.

The partition wall 146 can be formed to have a taper angle of about 90 degrees due to an increase in adhesion energy during curing at a temperature of 120° C.

Due to a high step and taper of the vertical partition wall 146, the light emitting unit 132 deposited thereon can be disconnected (discontinued).

Two or more, a plurality of the partition walls 146 are provided and the trench pattern T provided by removing the bank 115h and the planarization layer 115g can be disposed between the partition walls 146.

Also, a groove H having a step, which exposes the bank 115h can be formed between the partition wall 146 at an innermost portion and the end of the light emitting unit 132. The groove H is formed over four sides of the non-active area NA surrounding the active area AA and can have a quadrangular frame shape, but is not limited thereto. The groove H can be formed over three sides of the non-active area NA except for the lower portion of the display panel 110.

At least one trench pattern T can be disposed between the partition walls 146, and can have a quadrangular frame shape over four sides of the non-active area NA surrounding the active area AA, but is limited thereto. The at least one trench pattern T can be formed over three sides of the non-active area NA except for the lower portion of the display panel 110.

In this case, in the trench pattern T, the bank 115h and the planarization layer 115g between the partition walls 146 can be removed to thereby expose a portion of the sacrificial layer 145 therebelow.

At a lower end of the trench pattern T, an undercut UC can be formed by removing the planarization layer 115g so that a portion of the planarization layer 115g is recessed inwardly, but is not limited thereto.

The undercut UC can also have a quadrangular frame shape over four sides of the non-active area NA along the trench pattern T, but is not limited thereto, and can be formed over three sides of the non-active area NA except for the lower portion of the display panel 110.

Reliability of the display panel 110 can be improved by preventing diffusion of residual foreign materials and penetration of moisture due to the groove H, the trench pattern T, and the undercut UC.

In addition, the existing shadow area is converted into a reliable bezel area by the forming of the groove H, the trench pattern T, and the undercut UC, so that a bezel width can be reduced.

Meanwhile, the present disclosure is characterized in that a buffer layer 140 formed of silicon nitride is formed on the capping layer 134 and the partition wall 146 as well as inner portions of the groove H and the trench pattern T. For example, for example, the buffer layer 140 can be formed to cover the capping layer 134 and the partition wall 146 as well as lower surfaces and side surfaces of the groove H and the trench pattern T. In addition, the buffer layer 140 can be formed to cover the partition wall 146 at an outermost portion and a side surface of the bank 115h.

Since silicon nitride (SiNx) has a higher density than silicon oxide (SiOx), it is effective in preventing hydrogen diffusion.

Accordingly, the present disclosure is characterized in that the buffer layer 140 formed of silicon nitride is formed on the capping layer 134 and the partition wall 146 as well as the inner portions of the groove H and the trench pattern T to thereby prevent diffusion of hydrogen into the active area AA.

Adhesive layers 150 and 155 and the encapsulation substrate 160 can be disposed over the buffer layer 140.

The adhesive layers 150 and 155 can include a first adhesive layer 150 for improving adhesion with underlying components and a second adhesive layer 155 which is a face seal adhesive serving as a moisture barrier.

The first adhesive layer 150 can be formed to cover the buffer layer 140 as well as the inner portions of the groove H and the trench pattern T. The first adhesive layer 150 can extend to the non-active area NA to cover the inclined side surface of the planarization layer 115g and an exposed surface of the second buffer layer 115b, for example, but is not limited thereto.

The second adhesive layer 155 can protect the light emitting element 130 in the active area AA together with the capping layer 134 and the encapsulation substrate 160 from external moisture, oxygen, impacts, and the like. The second adhesive layer 155 can further include a moisture absorbent 156 such as a getter.

The moisture absorbent 156 can be particles having moisture absorption properties, and can absorb moisture and oxygen from the outside, thereby minimizing penetration of moisture and oxygen into the active area AA.

The encapsulation substrate 160 can be disposed on the second adhesive layer 155. The encapsulation substrate 160 can protect the light emitting element 130 together with the second adhesive layer 155. The encapsulation substrate 160 can protect the light emitting element 130 from external moisture, oxygen, impact, and the like.

Hereinafter, a moisture penetration prevention configuration of the present disclosure through a manufacturing process will be described.

FIGS. 5A to 5H are cross-sectional views illustrating a manufacturing process of the electroluminescent display device of FIG. 4.

Figure 6:
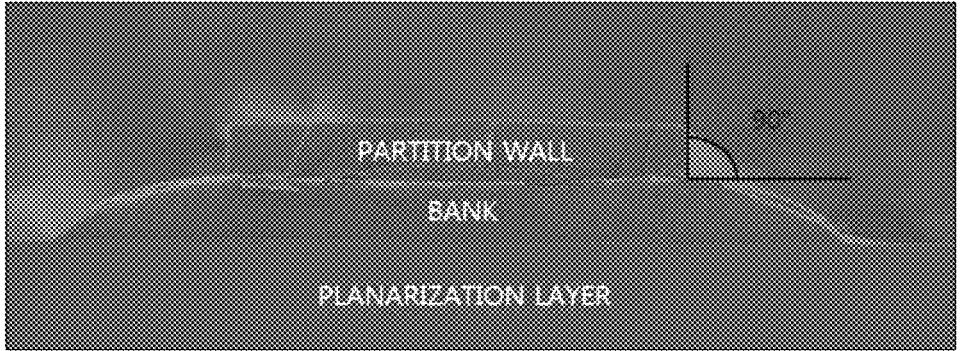
FIG. 6 is a photograph showing a vertical partition wall as an example.

FIG. 6 is a photograph showing a vertical partition wall as an example.

Figure 7A:
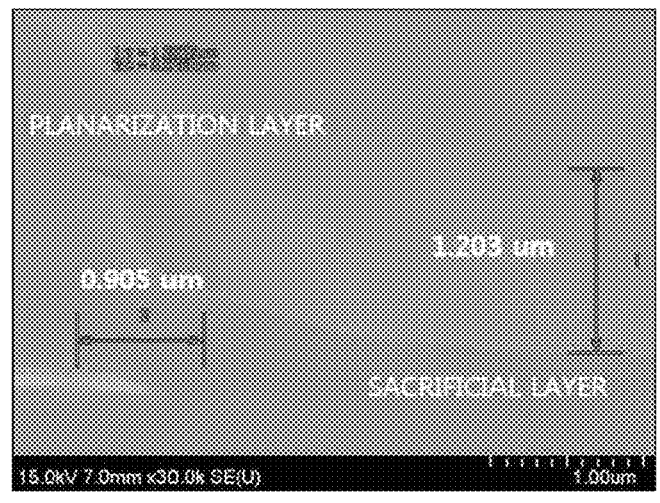
FIGS. 7A to 7C are photographs showing an undercut shape over etching time.
Figure 7B:
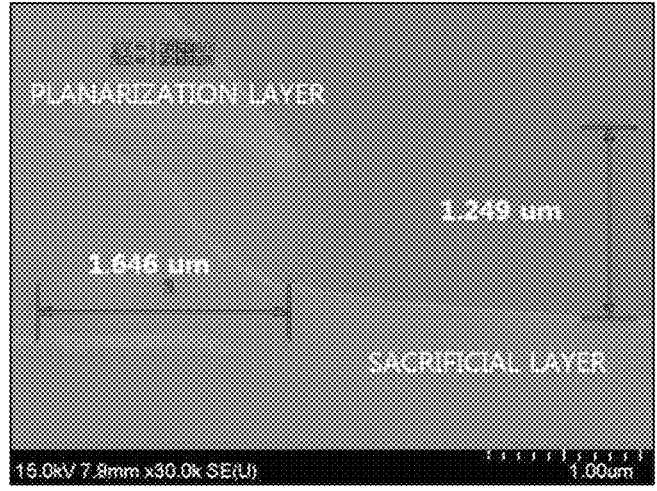
Figure 7C:
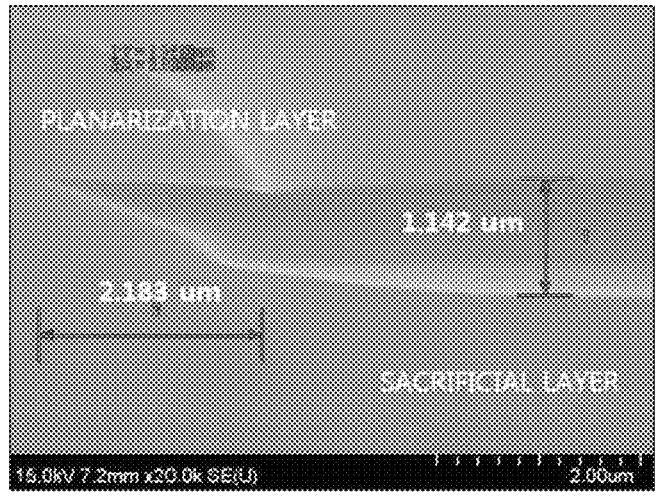

FIGS. 7A to 7C are photographs showing an undercut shape over etching time.

Figure 5A:
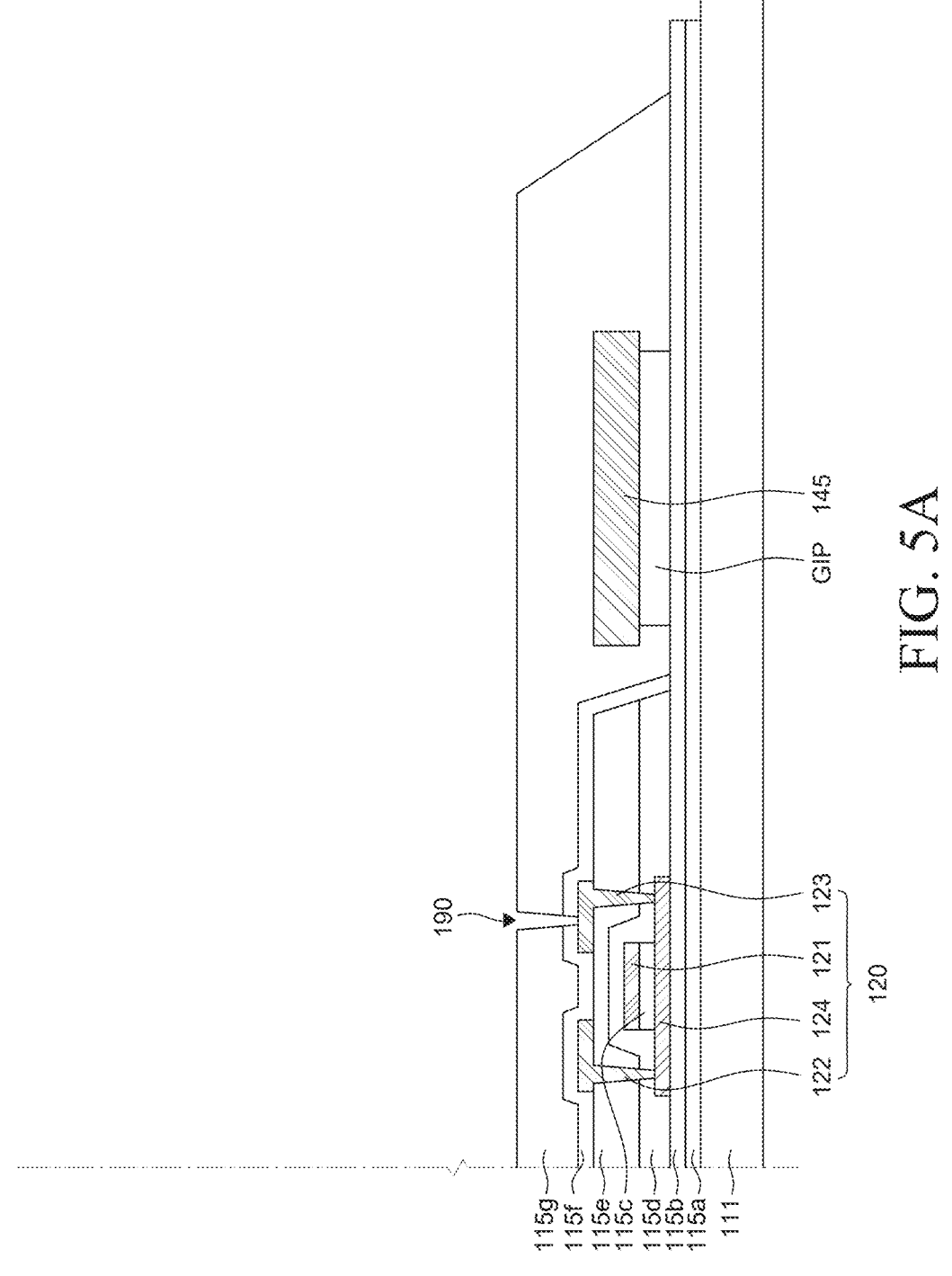
FIGS. 5A to 5H are cross-sectional views illustrating a manufacturing process of the electroluminescent display device of FIG. 4.

First, referring to FIG. 5A, the thin film transistor 120 and the GIP circuit unit GIP can be formed on the substrate 111.

To this end, the substrate 111 divided into an active area and a non-active area is prepared.

The substrate 111 can be formed of a flexible material such as plastic. For example, the substrate 111 can be in the form of a film including one of the group consisting of a polyester-based polymer, a silicone-based polymer, an acrylic polymer, a polyolefin-based polymer, and a copolymer thereof.

Subsequently, a light blocking layer can be formed on the substrate 111.

For example, the light blocking layer can be formed in a single layer or multilayer structure formed of any one of opaque metals such as aluminum (Al), chromium (Cr), tungsten (W), titanium (Ti), neodymium (Nd), nickel (Ni), molybdenum (Mo) and copper (Cu), or alloys thereof.

The buffer layers 115a and 115b can be formed on the substrate 111 on which the light blocking layer is disposed.

The buffer layers 115a and 115b can have a multilayer structure including the first buffer layer 115a and the second buffer layer 115b, and can be formed of silicon oxide (SiOx), silicon nitride (SiNx), or a multilayer structure thereof.

The thin film transistor 120 can be formed on the buffer layers 115a and 115b.

A detailed configuration of the thin film transistor 120 is as described above.

Subsequently, the passivation layer 115f can be formed on the thin film transistor 120. For example, the passivation layer 115f can be formed of an inorganic insulating layer such as silicon oxide (SiOx) or silicon nitride (SiNx).

Meanwhile, the sacrificial layer 145 can be formed on the GIP circuit unit GIP in the non-active area.

The sacrificial layer 145 can function to prevent damage to the GIP circuit by absorbing laser energy generated during laser ablation for forming the trench pattern.

The sacrificial layer 145 can be formed of a black resin, but is not limited thereto.

The sacrificial layer 145 can have a thickness of about 2 μm, but is not limited thereto.

Thereafter, the planarization layer 115g can be formed over the thin film transistor 120 and the GIP circuit unit GIP.

The planarization layer 115g can be formed of one or more materials among acrylic resin, epoxy resin, phenolic resin, polyamides resin, polyimides resin, unsaturated polyesters resin, polyphenylene resin, benzocyclobutene resin and polyphenylene sulfides resins, but the present disclosure is not limited thereto.

The planarization layer 115g can be formed to extend to a portion of the non-active area including the GIP area, but is not limited thereto. The planarization layer 115g can be formed to have an inclined side surface, but is not limited thereto.

Subsequently, a portion of the passivation layer 115f and the planarization layer 115g can be removed to thereby form a contact hole 190 exposing a portion of the drain electrode 123.

Figure 5B:
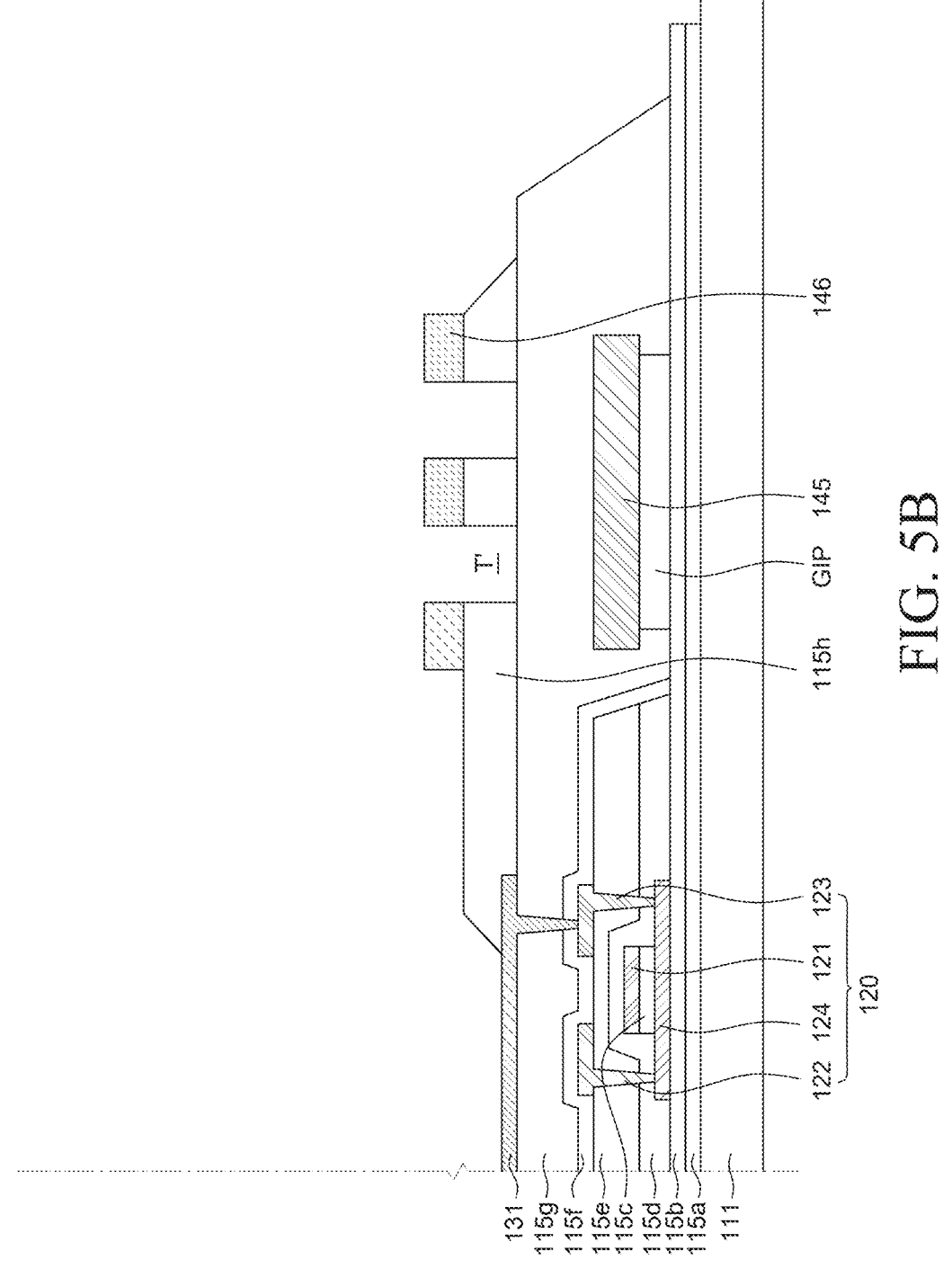

Next, referring to FIG. 5B, the anode 131 can be formed on the planarization layer 115g.

The anode 131 can be electrically connected to the thin film transistor 120 through the contact hole 190.

In the case of the bottom emission type, the anode 131 can be formed of indium tin oxide (ITO), indium zinc oxide (IZO) or the like, which is a transparent conductive material, but the present disclosure is limited thereto.

On the other hand, in the case of the top emission type, the anode 131 can be a two-layer structure in which a transparent conductive layer formed of a transparent conductive material and a reflective layer are sequentially stacked, or a three-layer structure in which a transparent conductive layer, a reflective layer and a transparent conductive layer are sequentially stacked. The reflective layer can be formed of silver (Ag) or an alloy including silver.

Next, the bank 115h can be formed on the anode 131 and the planarization layer 115g.

In this case, the bank 115h in the emission area can be removed to thereby expose a portion of the anode 131. Also, the bank 115h can be formed to extend to a portion of the non-active area, but is not limited thereto. The bank 115h can be extended but do not reach the inclined side surface of the planarization layer 115g in the non-active area.

However, in the bank 115h, an area in which a trench pattern is to be formed can be removed, which is referred to as a preliminary trench pattern T'.

The preliminary trench pattern T' can be positioned above the sacrificial layer 145.

The preliminary trench pattern T' can expose an upper surface of the planarization layer 115g.

The number of the preliminary trench patterns T' can be formed according to the number of trench patterns to be formed.

The preliminary trench pattern T' can be formed in a quadrangular frame shape over four sides of the non-active area surrounding the active area, but is not limited thereto. The preliminary trench pattern T' can be formed over three sides of the non-active area NA except for the lower portion of the display panel 110 to which the flexible films are connected.

Next, the partition walls 146 can be formed on the bank 115h.

The partition walls 146 can be formed to have a height of about 2 μm on the bank 115h in the non-active area.

The partition walls 146 can be formed of flexible plastic such as polyethylene naphthalate (PEN), but are not limited thereto.

The partition walls 146 can be formed to have a taper angle of about 90 degrees, but are not limited thereto.

The partition walls 146 can have a quadrangular frame shape over four sides of the non-active area surrounding the active area, but are not limited thereto. The partition walls 146 can be formed over three sides of the non-active area except for the lower portion of the display panel to which the flexible films are connected.

The two or more, the plurality of partition walls 146 are formed and the preliminary trench pattern T' can be disposed between the partition walls 146.

The partition walls 146 can be formed to have a taper angle of about 90 degrees due to an increase in adhesion energy during curing at a temperature of 120° C. (see FIG. 6).

The vertical partition wall 146 on the bank 115h can disconnect the light emitting unit, the cathode, and the capping layer from the non-active area and can serve to prevent scattering of organic materials during laser ablation and remove air bubbles generated in a reversely tapered structure at the time of bonding with the encapsulation substrate and the adhesive layer.

Figure 5C:
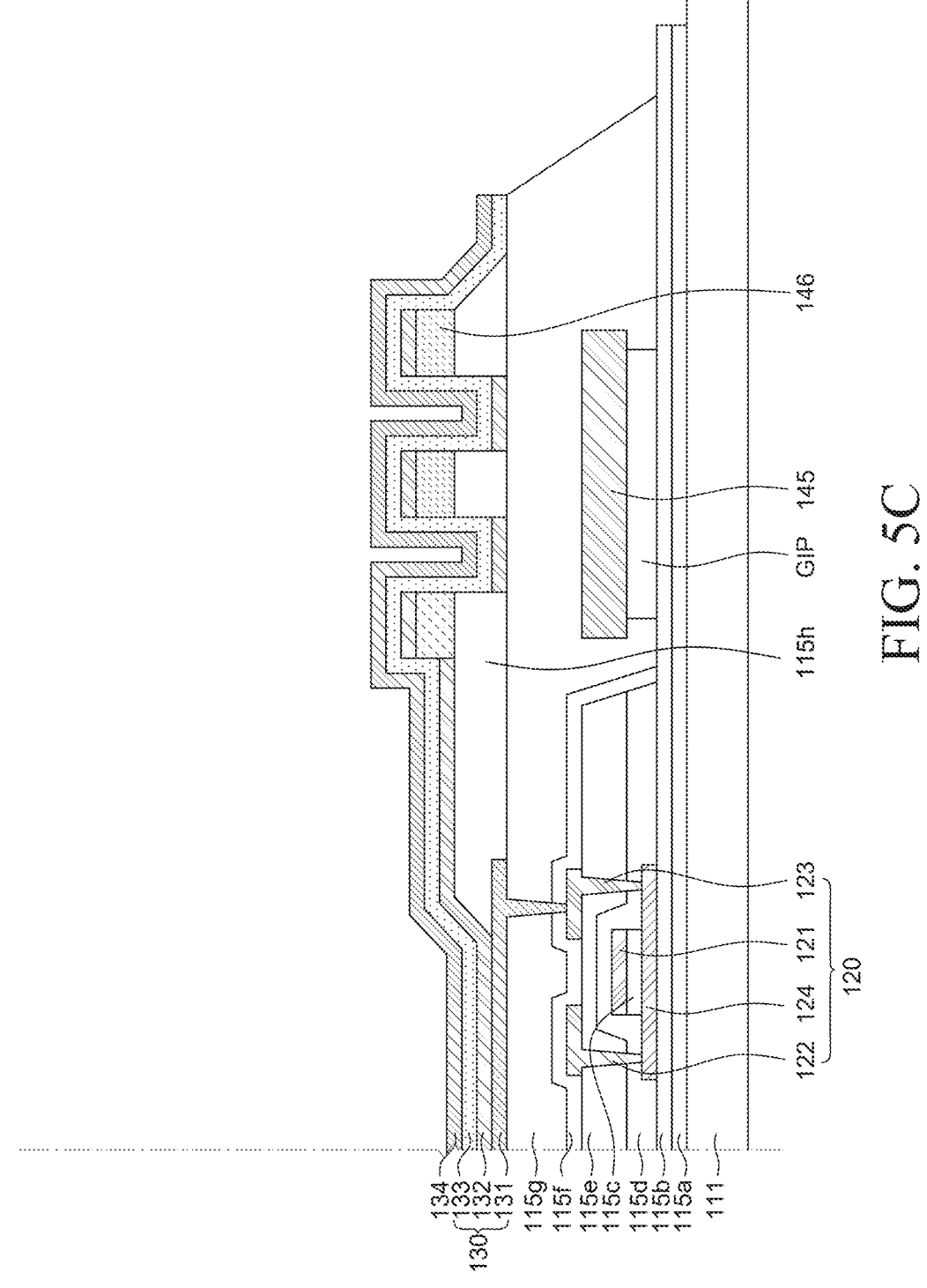

Next, referring to FIG. 5C, the light emitting unit 132 can be formed on the substrate 111 on which the bank 115h and the partition walls 146 are formed.

The light emitting unit 132 which serves to emit light, can include at least one layer of a hole injection layer (HIL), a hole transport layer (HTL), a light emitting layer, an electron transport layer (ETL), and an electron injection layer (EIL), and some of the components can be omitted according to a structure or characteristics of the electroluminescent display device.

The light emitting unit 132 can be formed to extend to a portion of the non-active area so as to cover the partition walls 146 and the preliminary trench pattern T', but is not limited thereto.

Subsequently, the cathode 133 and the capping layer 134 can be formed on the light emitting unit 132.

Since the cathode 133 needs to supply electrons, it can be formed of a metallic material such as magnesium or silver-magnesium, which is a conductive material having a low work function, but is not limited thereto.

On the other hand, in the case of the top emission type, the cathode 133 can be formed of a transparent conductive oxide, such as indium tin oxide (ITO), indium zinc oxide (IZO), indium tin zinc oxide (ITZO), zinc oxide (ZnO), and tin oxide (TO).

The cathode 133 can be formed to extend to a portion of the non-active area so as to cover the partition walls 146 and the preliminary trench pattern T'.

For example, the capping layer 134 can be formed of various organic compounds having a refractive index of 1.7 or higher in order to prevent light that is emitted to the outside from being lost due to total reflection.

The capping layer 134 can be formed to extend to a portion of the non-active area so as to cover the partition walls 146 and the preliminary trench pattern T'.

Figure 5D:
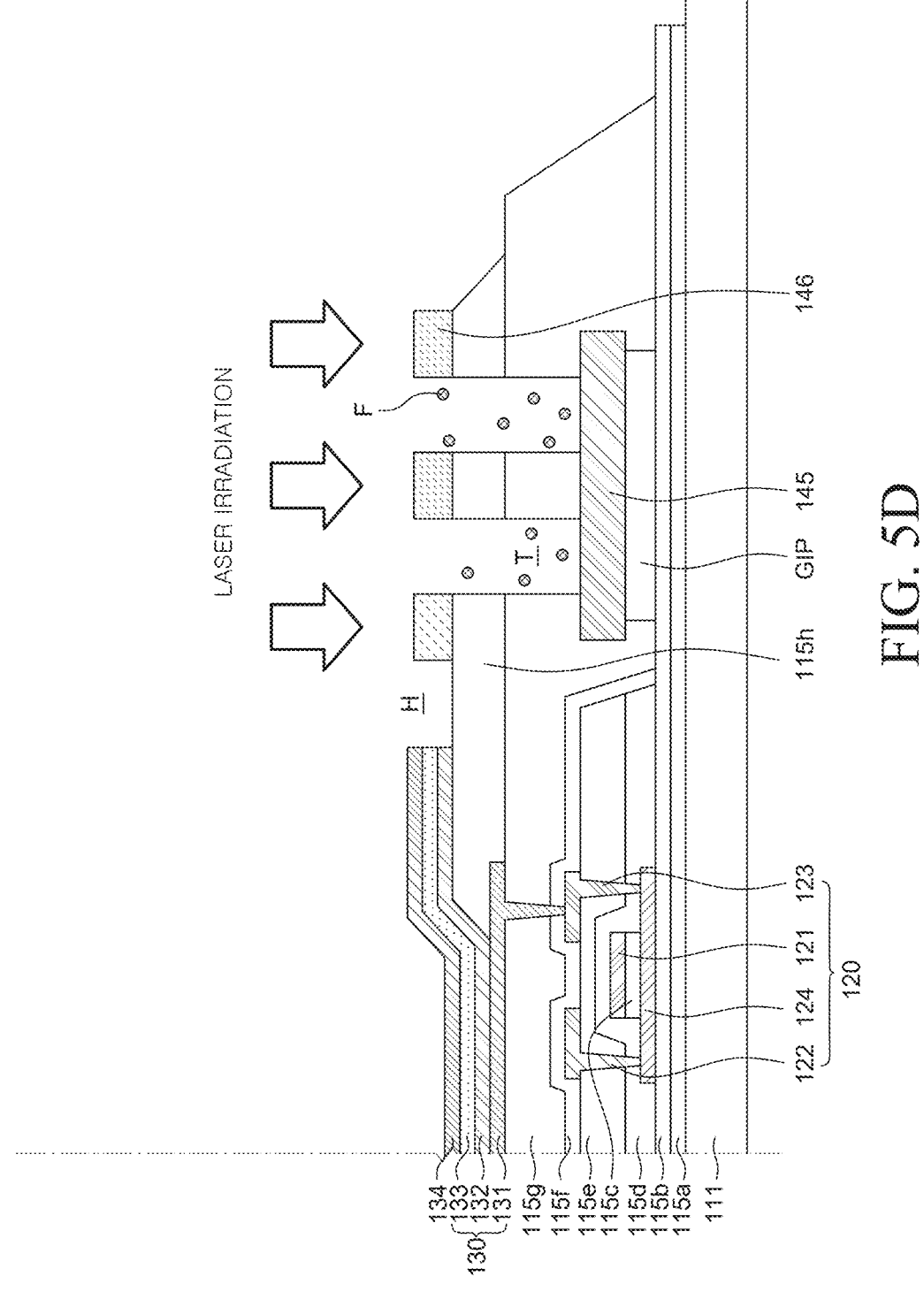

Next, referring to FIG. 5D, the capping layer 134, the cathode 133, the light emitting unit 132, and the planarization layer 115g in the non-active area, i.e., the GIP area, are selectively removed using a laser, so that the trench pattern T can be formed between the partition walls 146.

At this time, the capping layer 134, the cathode 133, and the light emitting unit 132 in the active area are selectively removed up to a boundary between the active area and the non-active area, so that a groove H having a step, which exposes the bank 115h can be formed between the partition wall 146 at the innermost portion and them. For example, the groove H can be formed over four sides of the non-active area surrounding the active area and can have a quadrangular frame shape, but is not limited thereto, and the groove H can be formed over three sides of the non-active area except for the lower portion of the display panel.

In addition, at least one trench pattern T can be disposed between the partition walls 146 and can have a quadrangular frame shape over four sides of the non-active area surrounding the active area, but is not limited thereto. The at least one trench pattern T can be formed over three sides of the non-active area except for the lower portion of the display panel. Also, in the trench pattern T, the bank 115*h* and the planarization layer 115*g* between the partition walls 146 can be removed to thereby expose a portion of the sacrificial layer 145 therebelow.

Meanwhile, foreign materials F grown by scattering organic materials that are removed by a laser can remain in the trench pattern T.

Figure 5E:
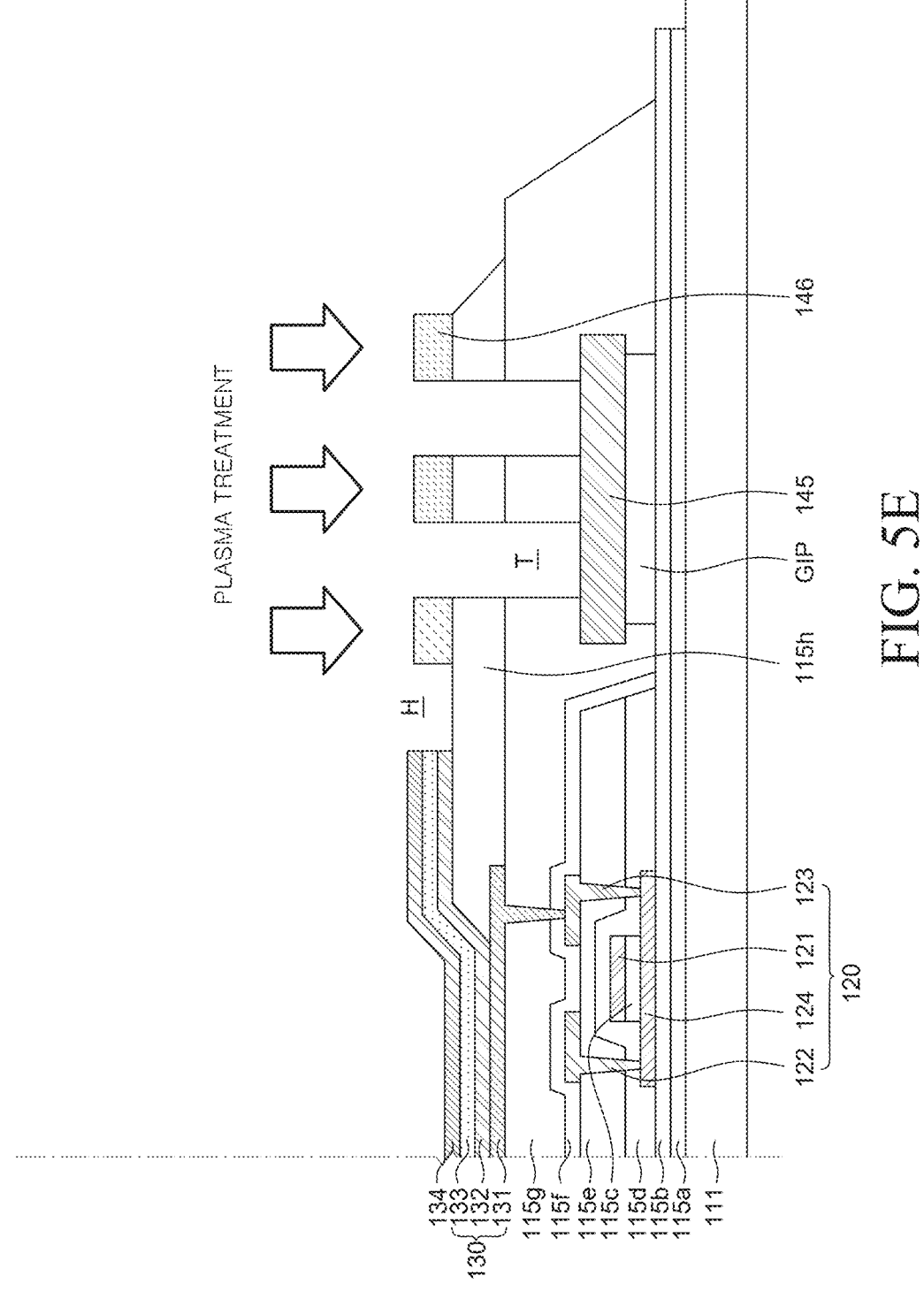

Then, referring to FIG. 5E, the foreign materials F remaining in the trench pattern T can be removed by plasma ashing treatment.

Figure 5F:
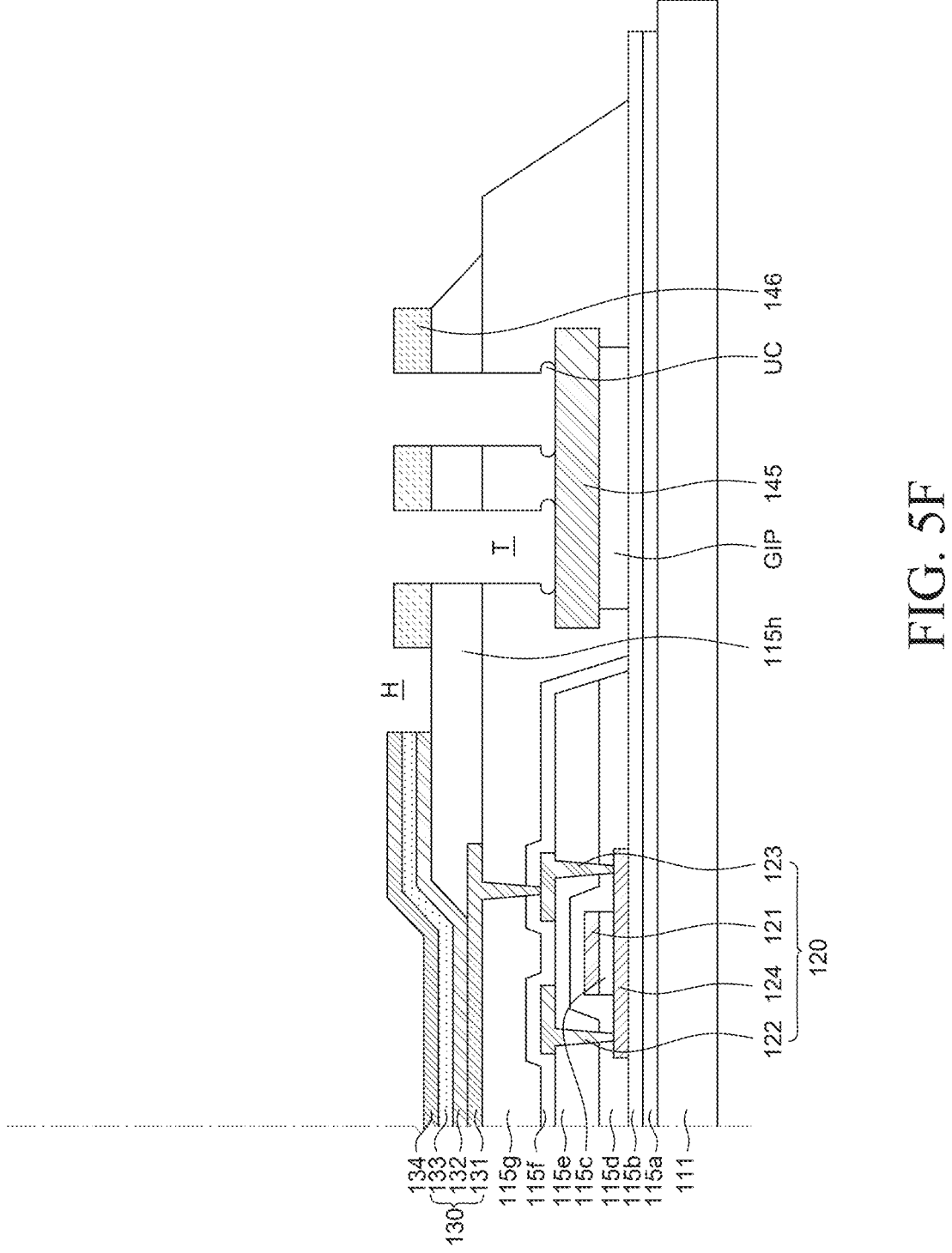

Thereafter, referring to FIG. 5F, an undercut UC can be formed in the trench pattern T simultaneously with removing the remaining foreign materials F by using a high-concentration buffered oxide enchant (BOE). In this case, the undercut UC can be formed so that a portion of the planarization layer 115*g* is inwardly recessed at the lower end of the trench pattern T.

The undercut UC can also have a quadrangular frame shape over four sides of the non-active area along the trench pattern T, but is not limited thereto, and the undercut UC can be formed over three sides of the non-active area except for the lower portion of the display panel.

In this case, referring to FIGS. 7A to 7C, it can be seen that a depth of the undercut UC increases over the etching time, and the undercut UC can be optimized by minimizing the time.

For example, FIG. 7A shows a case of etching with the BOE for 75 seconds, FIG. 7B shows a case of etching with the BOE for 100 seconds, and FIG. 7C shows a case of etching with the BOE for 125 seconds.

It can be seen that in the case of etching with the BOE for 75 seconds, the undercut UC is formed to have a depth of about 0.905 μm, in the case of etching with the BOE for 100 seconds, the undercut UC is formed to have a depth of about 1.646 μm, and in the case of etching with the BOE for 125 seconds, the undercut UC is formed to have a depth of about 2.183 μm.

In this case, a central portion of the sacrificial layer 145 (indicated as a black bank in FIGS. 7A to 7C) below the trench pattern T can be partially removed to be concave.

Figure 5G:
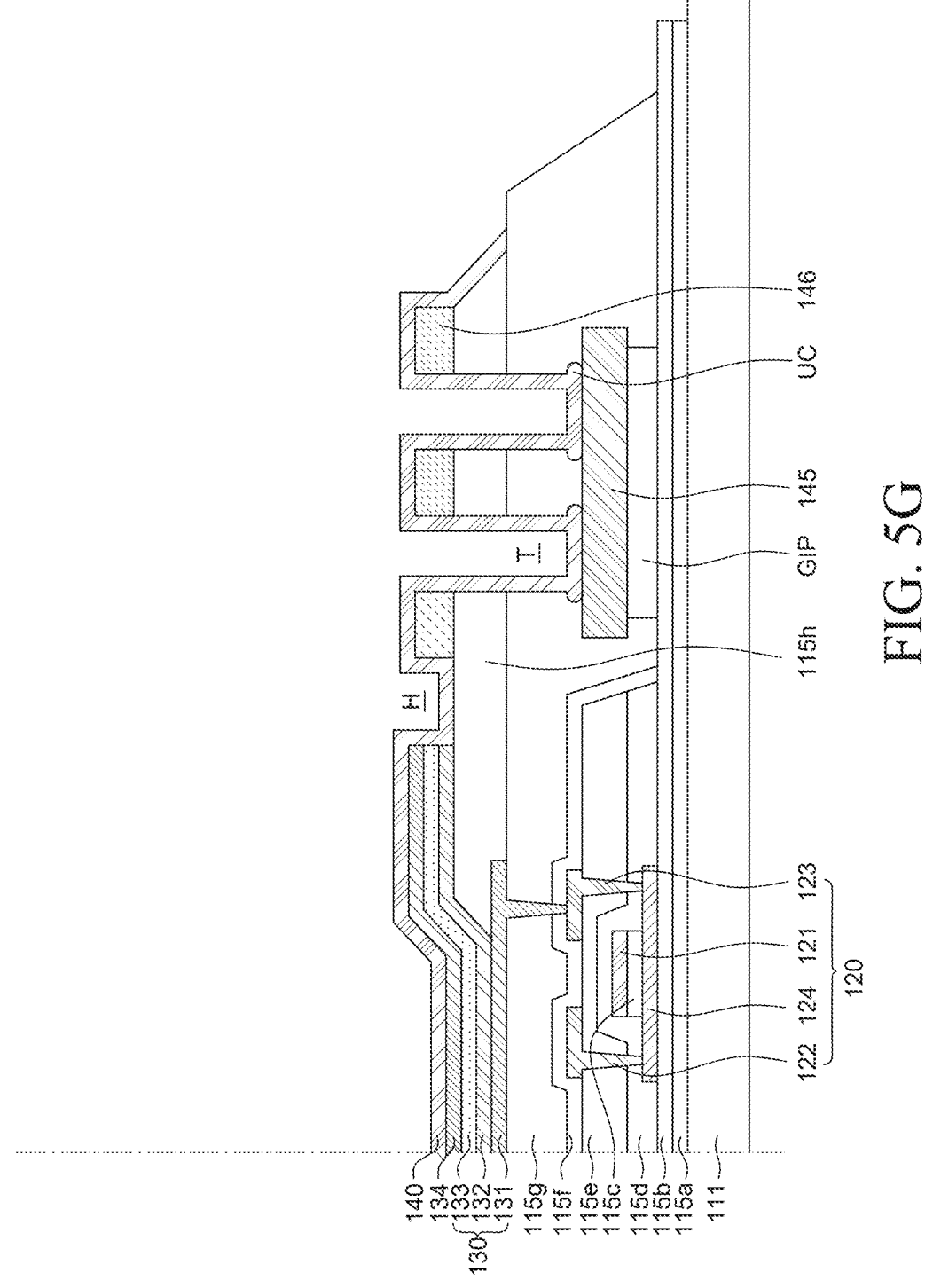

Subsequently, referring to FIG. 5G, the buffer layer 140 formed of silicon nitride can be formed on the capping layer 134 and the partition walls 146 as well as the inner portions of the groove H and the trench pattern T in order to prevent penetration of moisture into an area that is exposed to a laser.

For example, for example, the buffer layer 140 can be formed to cover the capping layer 134 and the partition walls 146 as well as the lower surfaces and the side surfaces of the groove H and the trench pattern T. In addition, the buffer layer 140 can be formed to cover the partition wall 146 at the outermost portion and the side surfaces of the bank 115*h*.

Figure 5H:
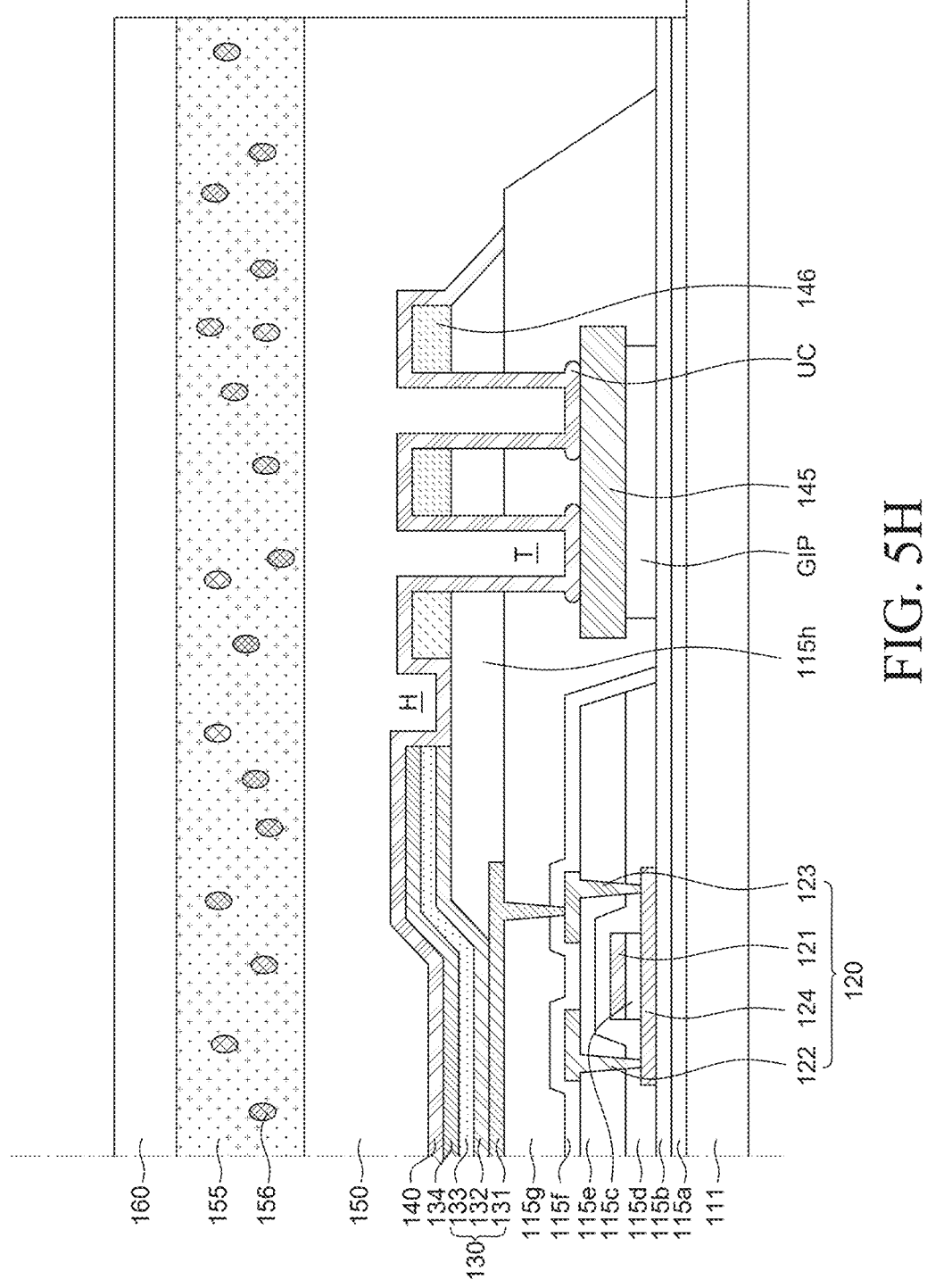

Then, referring to FIG. 5H, the encapsulation substrate 160 can be attached to an upper portion of the buffer layer 140 through the adhesive layers 150 and 155.

Meanwhile, as described above, the partition walls and the trench pattern of the present disclosure can be formed over three sides of the non-active area except for the lower portion of the display panel, which will be described with reference to FIG. 8.

Figure 8:
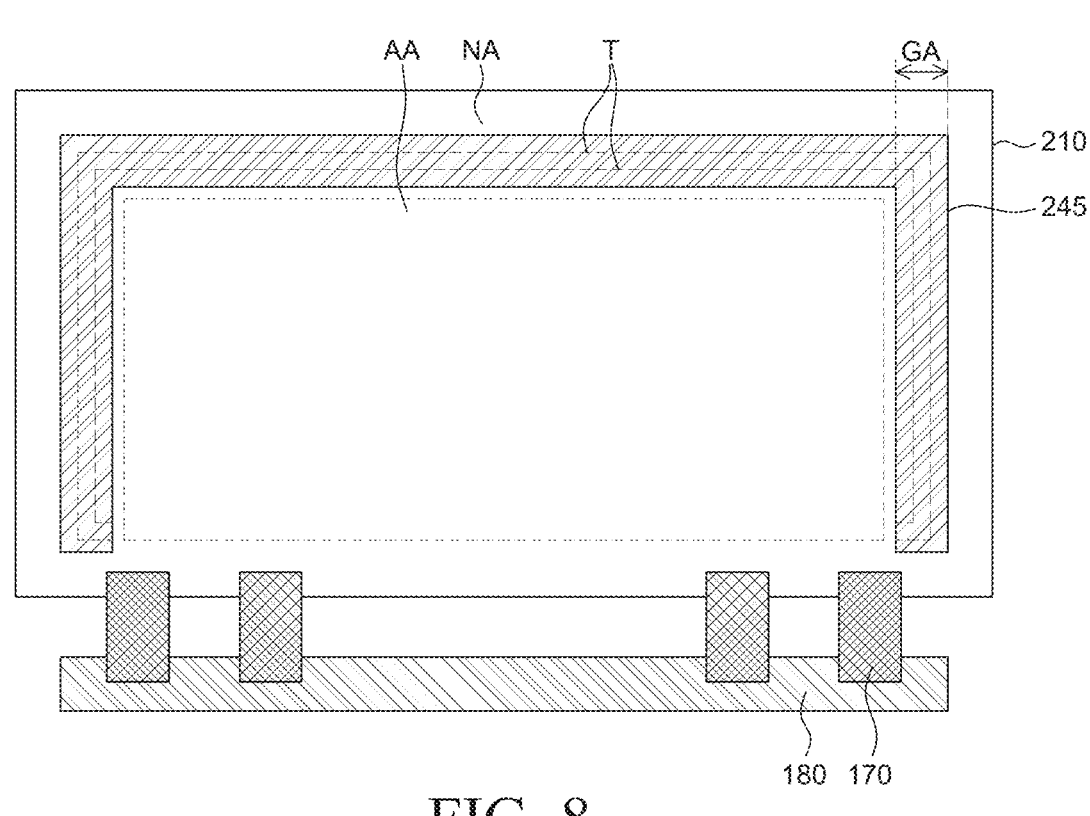
FIG. 8 is a plan view of an electroluminescent display device according to a second embodiment of the present disclosure.

FIG. 8 is a plan view of an electroluminescent display device according to a second exemplary embodiment of the present disclosure.

An electroluminescent display device 200 according to the second exemplary embodiment of the present disclosure shown in FIG. 8 is different from the first exemplary embodiment of FIGS. 3 and 4 only in terms of configurations of partition walls and a trench pattern T, and other configurations thereof are substantially the same. Thus, redundant descriptions will be omitted or may be briefly discussed. In this case, the same reference numerals are used for the same components.

Referring to FIG. 8, the electroluminescent display device 200 according to the second exemplary embodiment of the present disclosure can include a display panel 210, the flexible films 170, and the printed circuit board 180.

The display panel 210 can include an active area AA and a non-active area NA.

The non-active area NA can include a GIP area GA.

FIG. 8 illustrates that the non-active area NA surrounds the active area AA having a quadrangular shape, but shapes and arrangements of the active area AA and the non-active area NA are limited to the example illustrated in FIG. 8.

Further, left and right sides of FIG. 8 can be defined as a gate pad portion on which the gate driver IC is disposed, and a lower side of FIG. 8 can be defined as a data pad portion to which the flexible films are connected, but the present disclosure is not limited thereto.

The second exemplary embodiment of the present disclosure is characterized in that vertical partition walls and a trench pattern T are formed in an outside of the active area AA, for example, in a shadow area, to thereby prevent diffusion of residual foreign materials and moisture permeation, whereby reliability of the display panel 210 is improved. In addition, an existing shadow area is converted into a reliable bezel area, so that a bezel width can be reduced.

The partition walls and the trench pattern T according to the second exemplary embodiment of the present disclosure is characterized by being formed over three sides of the non-active area NA except for a lower portion of the display panel 210 to which the flexible films 170 are connected.

The trench pattern T can be formed by, for example, removing a capping layer, a cathode, a light emitting unit, and a planarization layer between the partition walls in the shadow area through laser ablation. Accordingly, a reliable bezel area can be expanded, and a bezel width can be reduced by an amount equal to a length of the reliable bezel area that is added.

In addition, the second exemplary embodiment of the present disclosure is characterized in that a sacrificial layer 245 is formed under the partition walls and trench pattern T along the partition walls and trench pattern T to absorb laser energy generated during laser ablation, thereby preventing damage to a GIP circuit.

The sacrificial layer 245 can be formed of a black resin, but is not limited thereto. The sacrificial layer 245 can have a thickness of about 2 μm, but is not limited thereto.

The sacrificial layer 245 can also include the GIP area GA, and can be formed over three sides of the non-active area NA except for the lower portion of the display panel 210 to which the flexible films 170 are connected.

Meanwhile, in the buffer layer formed of silicon nitride that is disposed on the capping layer and the partition walls as well as the inner portion of the trench pattern, hydrogen is generated during deposition and can penetrate into a lower portion thereof. Accordingly, a third exemplary embodiment of the present disclosure is characterized in that a hydrogen blocking layer of ITO is formed on the planarization layer over the sacrificial layer, which will be described in detail with reference to FIGS. 9 and 10.

Figure 9:
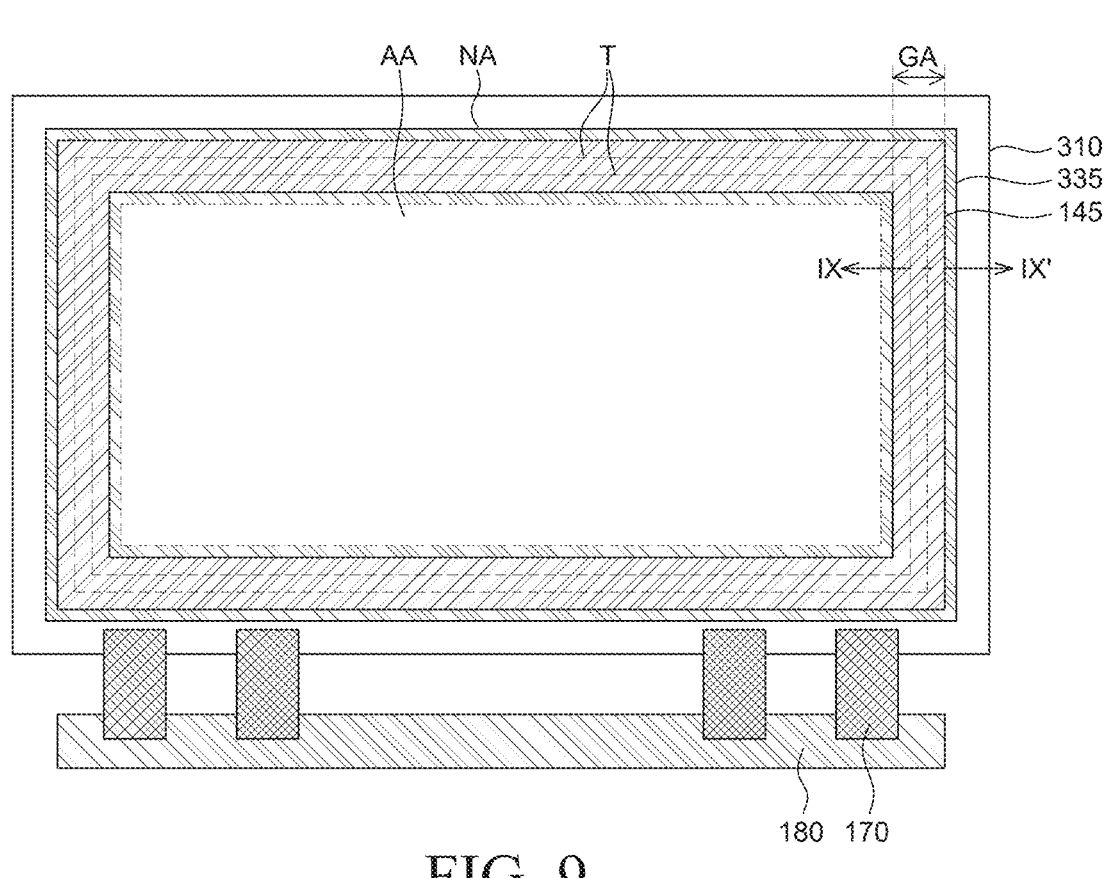
FIG. 9 is a plan view of an electroluminescent display device according to a third embodiment of the present disclosure.

FIG. 9 is a plan view of an electroluminescent display device according to a third exemplary embodiment of the present disclosure.

Figure 10:
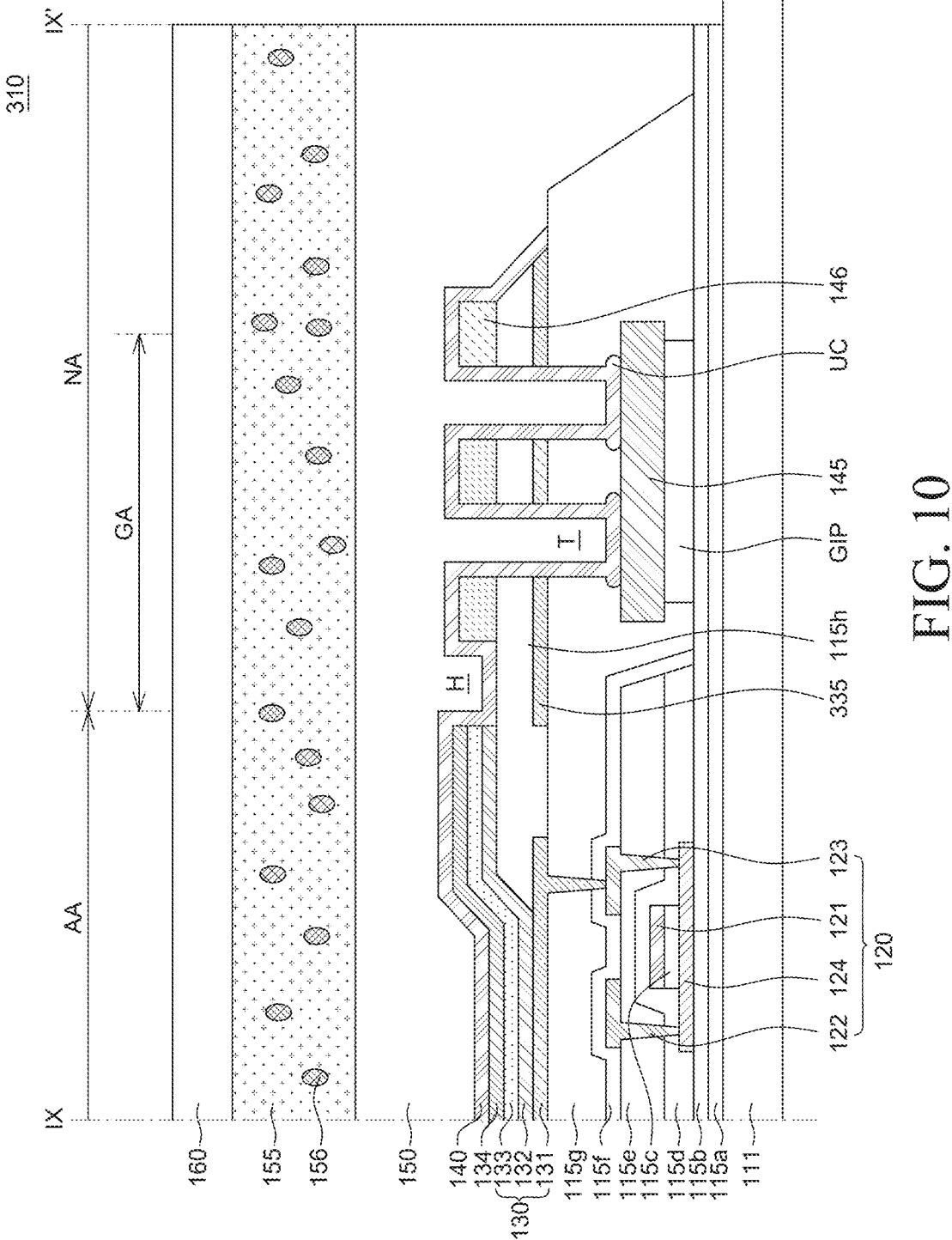
FIG. 10 is a cross-sectional view taken along IX-IX' of FIG. 9.

FIG. 10 is a cross-sectional view taken along IX-IX' of FIG. 9.

An electroluminescent display device 300 of the third exemplary embodiment of the present disclosure shown in FIGS. 9 and 10 is different from the first exemplary embodiment of FIGS. 3 and 4 described above, only in terms of a configuration of a hydrogen blocking layer 335 formed on the planarization layer 115g over the sacrificial layer 145, and other configurations thereof are substantially the same. Thus, redundant descriptions will be omitted or may be briefly discussed. In this case, the same reference numerals are used for the same components.

Referring to FIGS. 9 and 10, the electroluminescent display device 300 according to the third exemplary embodiment of the present disclosure can include a display panel 310, the flexible films 170, and the printed circuit board 180.

The display panel 310 can include an active area AA and a non-active area NA. The non-active area NA can include a GIP area GA.

FIG. 9 illustrates that the non-active area NA surrounds the active area AA having a quadrangular shape, but shapes and arrangements of the active area AA and the non-active area NA are limited to the example illustrated in FIG. 9.

The sacrificial layer 145 can be disposed on the GIP circuit unit GIP in the non-active area NA.

The sacrificial layer 145 is characterized by preventing damage to a GIP circuit by absorbing laser energy that is generated during laser ablation for forming a trench pattern T. Accordingly, a laser patterning area can be minimized, so that a bezel width can be reduced.

The sacrificial layer 145 can be formed of a black resin, but is not limited thereto. The sacrificial layer 145 can have a thickness of about 2 μm, but is not limited thereto.

The planarization layer 115g can be disposed over the thin film transistor 120 and the sacrificial layer 145. The anode 131 can be disposed on the planarization layer 115g in the active area AA.

Also, the partition walls 146 can be disposed on the bank 115h in the non-active area NA. The partition walls 146 can be formed of flexible plastic such as polyethylene naphthalate (PEN), but are not limited thereto.

The partition walls 146 can have a taper angle of about 90 degrees to prevent diffusion of residual foreign materials, but is not limited thereto.

The partition walls 146 can have a quadrangular frame shape over four sides of the non-active area NA surrounding the active area AA, but are not limited thereto, and can be formed over three sides of the non-active area NA except for a lower portion of the display panel 310 to which the flexible films are connected.

As the partition wall 146 is additionally disposed on the bank 115h in the non-active area NA, a cell gap, which is a distance from the encapsulation substrate 160, is reduced by the height of the partition wall 146 to thereby delay moisture penetration.

The partition wall 146 can be formed to have a taper angle of about 90 degrees due to an increase in adhesion energy during curing at a temperature of 120° C.

Due to a high step and taper of the vertical partition wall 146, the light emitting unit 132 deposited thereon can be disconnected (discontinued).

Two or more, a plurality of the partition walls 146 are provided and the trench pattern T provided by removing the bank 115h and the planarization layer 115g can be disposed between the partition walls 146.

Also, a groove H having a step, which exposes the bank 115h can be formed between the partition wall 146 at an innermost portion and an end of the light emitting unit 132. The groove H is formed over four sides of the non-active area NA surrounding the active area AA and can have a quadrangular frame shape, but is not limited thereto. The groove H can be formed over three sides of the non-active area NA except for the lower portion of the display panel 310.

At least one trench pattern T can be disposed between the partition walls 146, and can have a quadrangular frame shape over four sides of the non-active area NA surrounding the active area AA, but is limited thereto. The at least one trench pattern T can be formed over three sides of the non-active area NA except for the lower portion of the display panel 310.

In this case, in the trench pattern T, the bank 115h and the planarization layer 115g between the partition walls 146 can be removed to thereby expose a portion of the sacrificial layer 145 therebelow.

At a lower end of the trench pattern T, an undercut UC can be formed by removing the planarization layer 115g so that a portion of the planarization layer 115g is recessed inwardly, but is not limited thereto.

The undercut UC can also have a quadrangular frame shape over four sides of the non-active area NA along the trench pattern T, but is not limited thereto, and can be formed over three sides of the non-active area NA except for the lower portion of the display panel 310.

Reliability of the display panel 310 can be improved by preventing diffusion of residual foreign materials and penetration of moisture due to the groove H, the trench pattern T, and the undercut UC.

In addition, an existing shadow area is converted into a reliable bezel area by the forming of the groove H, the trench pattern T, and the undercut UC, so that a bezel width can be reduced.

Meanwhile, the present disclosure is characterized in that the buffer layer 140 formed of silicon nitride is formed on the capping layer 134 and the partition wall 146 as well as inner portions of the groove H and the trench pattern T. For example, for example, the buffer layer 140 can be formed to cover the capping layer 134 and the partition wall 146 as well as lower surfaces and side surfaces of the groove H and the trench pattern T. In addition, the buffer layer 140 can be formed to cover the partition wall 146 at the outermost portion and the side surface of the bank 115h.

In addition, the third exemplary embodiment of the present disclosure is characterized in that the hydrogen blocking layer 335 is disposed on the planarization layer 115g in the non-active area NA. In this case, the hydrogen blocking layer 335 can extend to a portion of the non-active area NA as well as the GIP area GA, but is not limited thereto.

In the buffer layer 140 formed of silicon nitride that is disposed on the capping layer 134 and the partition wall 146 as well as the inner portion of the trench pattern T, hydrogen can be generated during deposition and can penetrate into a lower portion thereof. Accordingly, the third exemplary embodiment of the present disclosure is characterized in that the hydrogen blocking layer 335 of ITO is formed on the planarization layer 115g over the sacrificial layer 145. Accordingly, it is possible to prevent movements in a threshold voltage Vth of a circuit element in the GIP circuit unit GIP due to hydrogen penetration and improve reliability of the circuit element.

For example, the hydrogen blocking layer 335 can extend from a boundary between the active area AA and the non-active area NA to a portion of the non-active area NA including the GIP area GA.

The hydrogen blocking layer 335 can be formed of indium tin oxide (ITO), which is removed during laser ablation and at the same time, can block hydrogen, but is not limited thereto.

The adhesive layers 150 and 155 and the encapsulation substrate 160 can be disposed on the buffer layer 140.

Meanwhile, the hydrogen blocking layer of the present disclosure can be formed on the side surface of the trench pattern, which will be described with reference to FIG. 11.

Figure 11:
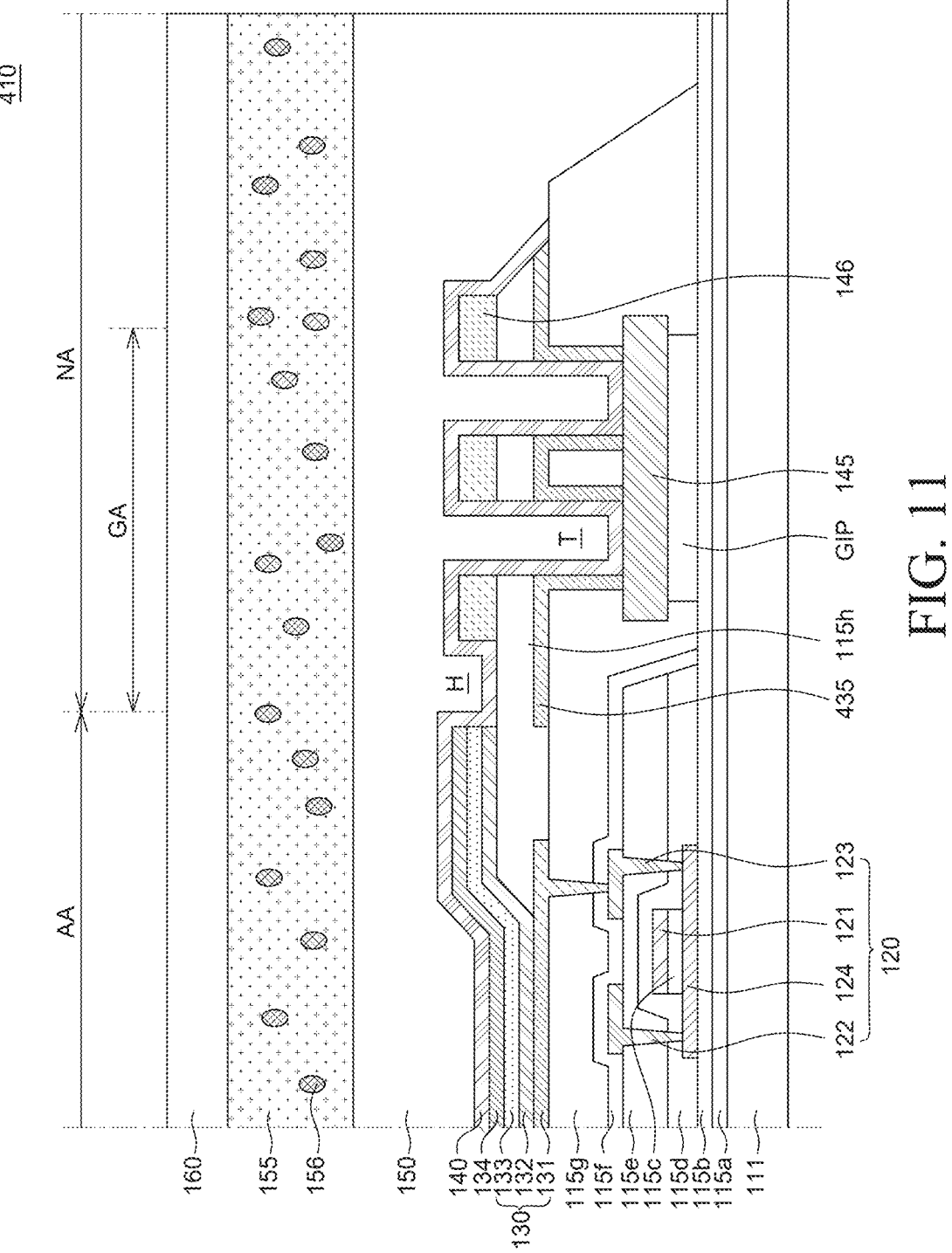
FIG. 11 is a cross-sectional view of an electroluminescent display device according to a fourth embodiment of the present disclosure.

FIG. 11 is a cross-sectional view of an electroluminescent display device according to a fourth exemplary embodiment of the present disclosure.

An electroluminescent display device of the fourth exemplary embodiment of the present disclosure shown in FIG. 11 is different from the third exemplary embodiment of the present disclosure shown in FIGS. 9 and 10 only in terms of a configuration of a hydrogen blocking layer 435, and other configurations thereof are substantially different. Thus, redundant descriptions will be omitted. In this case, the same reference numerals are used for the same components.

Referring to FIG. 11, the electroluminescent display device according to the fourth exemplary embodiment of the present disclosure can include a display panel 410 divided into an active area AA and a non-active area NA.

The non-active area NA can include a GIP area GA.

The sacrificial layer 145 can be disposed on a GIP circuit unit GIP in the non-active area NA. The sacrificial layer 145 can be formed of a black resin, but is not limited thereto. The sacrificial layer 145 can have a thickness of about 2 μm, but is not limited thereto.

The planarization layer 115g can be disposed over the thin film transistor 120 and the sacrificial layer 145.

The anode 131 can be disposed on the planarization layer 115g in the active area AA.

Also, the partition walls 146 can be disposed on the bank 115h in the non-active area NA. The partition walls 146 can be formed of flexible plastic such as polyethylene naphthalate (PEN), but are not limited thereto.

The partition walls 146 can have a taper angle of about 90 degrees to prevent diffusion of residual foreign materials, but are not limited thereto.

The partition walls 146 can have a quadrangular frame shape over four sides of the non-active area NA surrounding the active area AA, but are not limited thereto.

Two or more, a plurality of the partition walls 146 are provided and the trench pattern T provided by removing the bank 115h and the planarization layer 115g can be disposed between the partition walls 146.

Also, a groove H having a step, which exposes the bank 115h can be formed between the partition wall 146 at an innermost portion and an end of the light emitting unit 132. The groove H is formed over four sides of the non-active area NA surrounding the active area AA and can have a quadrangular frame shape, but is not limited thereto.

At least one trench pattern T can be disposed between the partition walls 146, and can have a quadrangular frame shape over four sides of the non-active area NA surrounding the active area AA, but is limited thereto.

In this case, in the trench pattern T, the bank 115h and the planarization layer 115g between the partition walls 146 can be removed to thereby expose a portion of the sacrificial layer 145 therebelow.

The buffer layer 140 formed of silicon nitride can be disposed on the capping layer 134 and the partition walls 146 as well as the inner portions of the groove H and the trench pattern T.

In addition, the fourth exemplary embodiment of the present disclosure is characterized in that the hydrogen blocking layer 435 is disposed on the planarization layer 115g in the non-active area NA. In this case, the hydrogen blocking layer 435 can extend to a portion of the non-active area NA including the GIP area GA, but the present disclosure is not limited thereto.

The hydrogen blocking layer 435 can be formed of indium tin oxide (ITO), which is removed during laser ablation and at the same time, can block hydrogen, but is not limited thereto.

For example, the hydrogen blocking layer 435 can extend from a boundary between the active area AA and the non-active area NA to a portion of the non-active area NA including the GIP area GA. In particular, the hydrogen blocking layer 435 according to the fourth exemplary embodiment of the present disclosure is characterized in that it is also disposed on the side surface of the trench pattern T.

Specifically, when a contact hole is formed in the planarization layer 115g in the active area AA, an open hole exposing the sacrificial layer 145 can be formed in the planarization layer 115g in the non-active area NA. In this case, the open hole can be formed in an area where a preliminary trench pattern and the trench pattern T are formed.

Subsequently, when the anode 131 is formed on the planarization layer 115g in the active area AA, the hydrogen blocking layer 435 can be formed on the planarization layer 115g in the non-active area NA as well as the open hole.

In this case, the hydrogen blocking layer 435 can be formed on the planarization layer 115g in the non-active area NA as well as a lower surface and a side surface of the open hole.

Next, the bank 115h can be formed on the anode 131 and the planarization layer 115g.

In the bank 115h, an area in which a trench pattern is to be formed, for example, an open hole area can be removed.

Next, the partition walls 146 can be formed on the bank 115h.

Two or more, a plurality of the partition walls 146 can be formed, and the open hole area can be disposed between the partition walls 146.

Next, the light emitting unit 132, the cathode 133, and the capping layer 134 can be formed on the substrate 111 on which the bank 115h and the partition walls 146 are formed.

The light emitting unit 132, the cathode 133, and the capping layer 134 can be formed to extend to a portion of the non-active area NA so as to cover the partition walls 146 and the open hole.

Next, the capping layer 134, the cathode 133, the light emitting unit 132, and the hydrogen blocking layer 435 in the non-active area NA, for example, in the GIP area GA, are selectively removed using a laser, so that the trench pattern T can be formed between the partition walls 146. In this case, the hydrogen blocking layer 435 can remain on the side surface of the trench pattern T.

The capping layer 134, the cathode 133, and the light emitting unit 132 in the active area AA are selectively removed up to the boundary between the active area AA and the non-active area NA, so that a groove H having a step, which exposes the bank 115*h* can be formed between the partition wall 146 at the innermost portion and them.

Thereafter, the buffer layer 140 formed of silicon nitride can be formed on the capping layer 134 and the partition wall 146 as well as inner portions of the groove H and the trench pattern T. In this case, the buffer layer 140 can be formed on an inner surface of the hydrogen blocking layer 435 on the side surface of the trench pattern T.

Thereafter, the adhesive layers 150 and 155 and the encapsulation substrate 160 can be disposed on the buffer layer 140.

The exemplary embodiments of the present disclosure can also be described as follows:

According to an aspect of the present disclosure, there is provided an electroluminescent display device. The electroluminescent display device includes a substrate including an active area and a non-active area having a gate in panel (GIP) area, a thin film transistor disposed on the substrate, a GIP circuit unit disposed on the substrate in the GIP area, a sacrificial layer disposed on the GIP circuit unit, a planarization layer disposed over the thin film transistor and the sacrificial layer, an anode disposed on the planarization layer, a bank disposed on the planarization layer and exposing a portion of the anode, a light emitting unit and a cathode disposed on the anode which is exposed and the bank, a trench pattern which is provided on the sacrificial layer and from which the cathode, the light emitting unit, the bank, and the planarization layer are removed and a buffer layer made of silicon nitride and disposed on the cathode and an inner surface of the trench pattern.

The electroluminescent display device can further include a capping layer disposed on the cathode, wherein the buffer layer can be disposed on the capping layer.

The electroluminescent display device can further include a plurality of partition walls disposed on the bank in the non-active area, wherein the trench pattern can be disposed between the partition walls.

The partition walls can be made of polyethylene naphthalate (PEB) (PEN), and the partition walls can have a vertical taper angle.

The partition walls and the trench pattern can be disposed over four sides of the non-active area surrounding the active area.

The partition walls and the trench pattern can be disposed over three sides of the non-active area except for a lower portion of the display panel to which a flexible film is connected.

The electroluminescent display device can further include a groove exposing the bank between an inner partition wall among the plurality of partition walls and an end of the light emitting unit.

The groove can be disposed over four sides of the non-active area surrounding the active area.

The buffer layer can be disposed to cover the partition walls as well as lower surfaces and side surfaces of the groove and the trench pattern.

The buffer layer can be disposed to cover an outer partition wall among the plurality of partition walls and a side surface of the bank.

The electroluminescent display device can further include an encapsulation substrate attached to an upper portion of the buffer layer through an adhesive layer.

The adhesive layer can include a first adhesive layer covering the buffer layer and inner portions of the groove and the trench pattern and a second adhesive layer disposed on the first adhesive layer and having a moisture absorbent.

The electroluminescent display device can further include a hydrogen blocking layer disposed on the planarization layer in the non-active area.

The hydrogen blocking layer can be disposed on the planarization layer over the sacrificial layer.

The hydrogen blocking layer can extend from a boundary between the active area and the non-active area to a portion of the non-active area including the GIP area, with exception of an inner portion of the trench pattern.

The hydrogen blocking layer can be made of indium tin oxide (ITO) on a same layer as the anode.

The hydrogen blocking layer can be disposed on a side surface of the trench pattern, wherein the buffer layer can be disposed on an inner surface of the hydrogen blocking layer in the trench pattern.

The trench pattern can expose a portion of the sacrificial layer.

The electroluminescent display device can further include an undercut which is configured at a lower end of the trench pattern and which is configured by removing the planarization layer so that a portion of the planarization layer is recessed inwardly.

The undercut can be disposed over four sides of the non-active area surrounding the active area.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An electroluminescent display device, comprising:
   a substrate including a display area and a non-display area having a gate in panel (GIP) area;
   a thin film transistor disposed on the substrate;
   a GIP circuit unit disposed on the substrate in the GIP area;
   a sacrificial layer disposed on the GIP circuit unit;
   a planarization layer disposed on the thin film transistor and the sacrificial layer;
   an anode disposed on the planarization layer;
   a bank disposed on the planarization layer and exposing a portion of the anode;
   a light emitting unit and a cathode disposed on the bank and the anode which is exposed;
   a trench pattern disposed on the sacrificial layer and from which the cathode, the light emitting unit, the bank, and the planarization layer are removed;

a buffer layer made of silicon nitride and disposed on the cathode and an inner surface of the trench pattern, wherein the sacrificial layer is disposed directly between the trench pattern and the GIP circuit unit along a direction perpendicular to a main surface of the substrate, and wherein the GIP circuit unit includes at least one element having a threshold voltage capable of movement due to hydrogen penetration.

2. The electroluminescent display device of claim 1, further comprising:

a capping layer disposed on the cathode, wherein the buffer layer is disposed on the capping layer.

3. The electroluminescent display device of claim 1, further comprising:

a plurality of partition walls disposed on the bank in the non-display area, wherein the trench pattern is disposed between the plurality of partition walls.

4. The electroluminescent display device of claim 3, wherein the plurality of partition walls are made of polyethylene naphthalate (PEN), and wherein the plurality of partition walls have a vertical taper angle.

5. The electroluminescent display device of claim 3, wherein the plurality of partition walls and the trench pattern are disposed over four sides of the non-display area surrounding the display area.

6. The electroluminescent display device of claim 3, wherein the plurality of partition walls and the trench pattern are disposed over three sides of the non-display area except for a portion of the non-display area to which a flexible film is connected.

7. The electroluminescent display device of claim 3, further comprising:

a groove exposing the bank between an inner partition wall among the plurality of partition walls and an end of the light emitting unit.

8. The electroluminescent display device of claim 7, wherein the groove is disposed over four sides of the non-display area so as to surround the display area.

9. The electroluminescent display device of claim 7, wherein the buffer layer is disposed to cover the plurality of partition walls as well as lower surfaces and side surfaces of the groove and the trench pattern.

10. The electroluminescent display device of claim 3, wherein the buffer layer is disposed to cover an outer partition wall among the plurality of partition walls and a side surface of the bank.

11. The electroluminescent display device of claim 7, further comprising:

an encapsulation substrate attached to an upper portion of the buffer layer through an adhesive layer.

12. The electroluminescent display device of claim 11, wherein the adhesive layer includes:

a first adhesive layer covering the buffer layer and inner portions of the groove and the trench pattern; and a second adhesive layer disposed on the first adhesive layer and having a moisture absorbent.

13. The electroluminescent display device of claim 1, further comprising:

a hydrogen blocking layer disposed on the planarization layer in the non-display area.

14. The electroluminescent display device of claim 13, wherein the hydrogen blocking layer is disposed on the planarization layer over the sacrificial layer.

15. The electroluminescent display device of claim 13, wherein the hydrogen blocking layer extends from a boundary between the display area and the non-display area to a portion of the non-display area including the GIP area, with exception of an inner portion of the trench pattern.

16. The electroluminescent display device of claim 13, wherein the hydrogen blocking layer is made of indium tin oxide (ITO) on a same layer as the anode.

17. The electroluminescent display device of claim 13, wherein the hydrogen blocking layer is disposed on a side surface of the trench pattern, and wherein the buffer layer is disposed on an inner surface of the hydrogen blocking layer in the trench pattern.

18. The electroluminescent display device of claim 1, wherein the trench pattern exposes a portion of the sacrificial layer.

19. The electroluminescent display device of claim 18, further comprising:

an undercut configured at a lower end of the trench pattern and configured by removing the planarization layer so that a portion of the planarization layer is recessed inwardly.

20. The electroluminescent display device of claim 19, wherein the undercut is disposed over four sides of the non-display area surrounding the display area.

* * * * *